United States Patent
Lin et al.

(10) Patent No.: US 11,190,217 B2
(45) Date of Patent: Nov. 30, 2021

(54) DATA WRITING METHOD, MEMORY CONTROLLING CIRCUIT UNIT AND MEMORY STORAGE DEVICE

(71) Applicant: PHISON ELECTRONICS CORP., Miaoli (TW)

(72) Inventors: Yu-Hsiang Lin, Yunlin County (TW); Shao-Wei Yen, Kaohsiung (TW); Chih-Kang Yeh, Kinmen County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 16/788,320

(22) Filed: Feb. 12, 2020

(65) Prior Publication Data

US 2020/0186171 A1    Jun. 11, 2020

Related U.S. Application Data

(63) Continuation-in-part of application No. 16/153,828, filed on Oct. 8, 2018, now Pat. No. 10,977,116.

(30) Foreign Application Priority Data

Aug. 23, 2018  (TW) .................. 107129490
Jan. 9, 2020   (TW) .................. 109100810

(51) Int. Cl.
  *H03M 13/29*   (2006.01)
  *G06F 11/10*   (2006.01)
  *H03M 13/53*   (2006.01)

(52) U.S. Cl.
  CPC ..... *H03M 13/2906* (2013.01); *G06F 11/1068* (2013.01)

(58) Field of Classification Search
  None
  See application file for complete search history.

(56) References Cited

U.S. PATENT DOCUMENTS

| | | | |
|---|---|---|---|
| 9,183,078 B1* | 11/2015 | Zhu ................... | G06F 11/1044 |
| 2002/0010892 A1* | 1/2002 | Lodge ............... | H03M 13/2721 714/777 |
| 2004/0008562 A1* | 1/2004 | Ito ..................... | G11C 11/40615 365/223 |

(Continued)

OTHER PUBLICATIONS

Gregori et al., On-chip error correcting techniques for new-generation flash memories, IEEE, vol. 91, Issue: 4, pp. 602-616 (Year: 2003).*

(Continued)

*Primary Examiner* — April Y Blair
*Assistant Examiner* — Dipakkumar B Gandhi
(74) *Attorney, Agent, or Firm* — JCIPRNET

(57) ABSTRACT

A data writing method, a memory controlling circuit unit and a memory storage device are provided. The method includes: obtaining a data; encoding a plurality of sub-data in the data to obtain a plurality of first error checking and correction codes respectively corresponding to the plurality of sub-data; writing the plurality of sub-data and the plurality of first error checking and correction codes into a first physical programming unit; encoding the plurality of sub-data to obtain a second error checking and correction code; and writing the second error checking and correction code into a second physical programming unit.

18 Claims, 17 Drawing Sheets

(56) References Cited

U.S. PATENT DOCUMENTS

| | | | |
|---|---|---|---|
| 2008/0301526 A1* | 12/2008 | Kohler | G11C 7/1006 |
| | | | 714/764 |
| 2009/0019321 A1 | 1/2009 | Radke | |
| 2009/0125726 A1* | 5/2009 | Iyer | G11C 16/22 |
| | | | 713/189 |
| 2009/0132886 A1* | 5/2009 | Oh | H03M 13/116 |
| | | | 714/752 |
| 2010/0207789 A1* | 8/2010 | Nieminen | H03M 13/2775 |
| | | | 341/81 |
| 2010/0262892 A1 | 10/2010 | Chu et al. | |
| 2013/0238958 A1 | 9/2013 | Radke | |
| 2014/0013184 A1* | 1/2014 | Takahashi | G06F 11/10 |
| | | | 714/763 |
| 2014/0337681 A1 | 11/2014 | Liang | |
| 2014/0372833 A1 | 12/2014 | Liang | |
| 2015/0188570 A1* | 7/2015 | Kwok | G06F 11/1076 |
| | | | 714/764 |
| 2015/0234692 A1* | 8/2015 | Chu | G06F 11/073 |
| | | | 714/704 |
| 2017/0031755 A1* | 2/2017 | Nakanishi | G11C 29/023 |
| 2017/0168893 A1* | 6/2017 | Lin | G11C 29/52 |

OTHER PUBLICATIONS

"Office Action of Taiwan Counterpart Application", dated Jul. 31, 2020, p. 1-p. 6.
Office Action of U.S. Related U.S. Appl. No. 16/153,828, dated May 8, 2020, pp. 1-32.

\* cited by examiner

DATA WRITING METHOD, MEMORY CONTROLLING CIRCUIT UNIT AND MEMORY STORAGE DEVICE

CROSS-REFERENCE TO RELATED APPLICATION

This application is a continuation-in-part application of and claims the priority benefit of U.S. application Ser. No. 16/153,828, filed on Oct. 8, 2018, now pending, which claims the priority benefit of Taiwan application serial no. 107129490, filed on Aug. 23, 2018. This application also claims the priority benefit of Taiwan application serial no. 109100810, filed on Jan. 9, 2020. The entirety of each of the above-mentioned patent applications is hereby incorporated by reference herein and made a part of this specification.

BACKGROUND

1. Technology Field

The disclosure relates to a data writing method, a memory controlling circuit unit and a memory storage device.

2. Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., a flash memory) ideal to be built in the portable multi-media devices as cited above.

In general, when a memory controller receives a write command from a host system, the memory controller generate a corresponding error correcting code (ECC code) or error detecting code (EDC) for a data corresponding to the write command, and the memory controller writes the data corresponding to the write command and the corresponding ECC or the EDC into the rewritable non-volatile memory module. Then, when the memory controller reads the data from the rewritable non-volatile memory module, the ECC or EDC corresponding to the data are also read, and an error checking and correcting circuit performs an error checking and correcting operation on the read data based on the ECC or EDC.

It should be noted that, in the conventional method, the data and the ECC or EDC corresponding to the data are normally written into the same physical programming unit in the rewritable non-volatile memory module. However, in the rewritable non-volatile memory module, different physical programming units have different reliabilities. For example, a probability of error occurring in decoding the data stored in one specific physical programming unit is smaller than a probability of error occurring in decoding the data stored in another physical programming unit. Accordingly, if the data and the ECC or EDC corresponding to the data are written into the physical programming unit with a lower reliability, there is a higher probability that the data to be read cannot be successfully decoded.

Therefore, how to effectively decode the data stored in the physical programming unit with the lower reliability to increase the probability of successful decoding is one of the problems to be solved by those skilled in the art.

SUMMARY

The disclosure provides a data writing method, a memory controlling circuit unit and a memory storage device that can effectively decode the data stored in the physical programming unit with the lower reliability to increase the probability of successful decoding.

The disclosure proposes a data writing method for a rewritable non-volatile memory module. The rewritable non-volatile memory module includes a plurality of physical erasing units. Each physical erasing unit among the physical erasing units includes a plurality of physical programming units. The method includes obtaining a data; encoding a plurality of sub-data in the data to obtain a plurality of first error checking and correction codes respectively corresponding to the plurality of sub-data; writing the plurality of sub-data and the plurality of first error checking and correction codes into a first physical programming unit among the plurality of physical programming units; encoding the plurality of sub-data to obtain a second error checking and correction code; and writing the second error checking and correction code into a second physical programming unit among the plurality of physical programming units.

The disclosure proposes a memory controlling circuit unit for a rewritable non-volatile memory module. The rewritable non-volatile memory module includes a plurality of physical erasing units. Each physical erasing unit among the physical erasing units includes a plurality of physical programming units. The memory controlling circuit unit includes: a host interface, an error checking and correcting circuit, a memory interface and a memory management circuit. The host interface is configured to couple to a host system. The memory interface is configured to couple to a rewritable non-volatile memory module. The memory management circuit is coupled to the host interface, the error checking and correcting circuit and the memory interface. The memory management circuit is configured to obtain a data. The error checking and correcting circuit is configured to encode a plurality of sub-data in the data to obtain a plurality of first error checking and correction codes respectively corresponding to the plurality of sub-data. The memory management circuit is further configured to write the plurality of sub-data and the plurality of first error checking and correction codes into a first physical programming unit among the plurality of physical programming units. The error checking and correcting circuit is further configured to encode the plurality of sub-data to obtain a second error checking and correction code. The memory management circuit is further configured to write the second error checking and correction code into a second physical programming unit among the plurality of physical programming units.

The disclosure proposes a memory storage device, which includes a connection interface unit, a rewritable non-volatile memory module and a memory controlling circuit unit. The connection interface unit is configured to couple to a host system. The rewritable non-volatile memory module includes a plurality of physical erasing units, and each physical erasing unit among the physical erasing units includes a plurality of physical programming units. The memory controlling circuit unit is coupled to the connection interface unit and the rewritable non-volatile memory module. The memory controlling circuit unit is configured to obtain a data. The memory controlling circuit unit is configured to encode a plurality of sub-data in the data to obtain a plurality of first error checking and correction codes respectively corresponding to the plurality of sub-data. The memory controlling circuit unit is further configured to write the plurality of sub-data and the plurality of first error checking and correction codes into a first physical programming unit among the plurality of physical programming units. The memory controlling circuit unit is further configured to encode the plurality of sub-data to obtain a second error checking and correction code. The memory controlling circuit unit is further configured to write the second error checking and correction code into a second physical programming unit among the plurality of physical programming units.

Based on the above, the data writing method, the memory controlling circuit unit and the memory storage device of the disclosure can generate multiple error checking and correction codes for a data, and store one of the error checking and correction codes into the physical programming unit with the higher reliability. In this way, as the probability of error occurring in the error checking and correction code stored in the physical programming unit with the higher reliability is lower, the data stored in the physical programming units with the lower reliability may be effectively improved and the probability of successful decoding may also be improved.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

DESCRIPTION OF THE EMBODIMENTS

Figure 1:
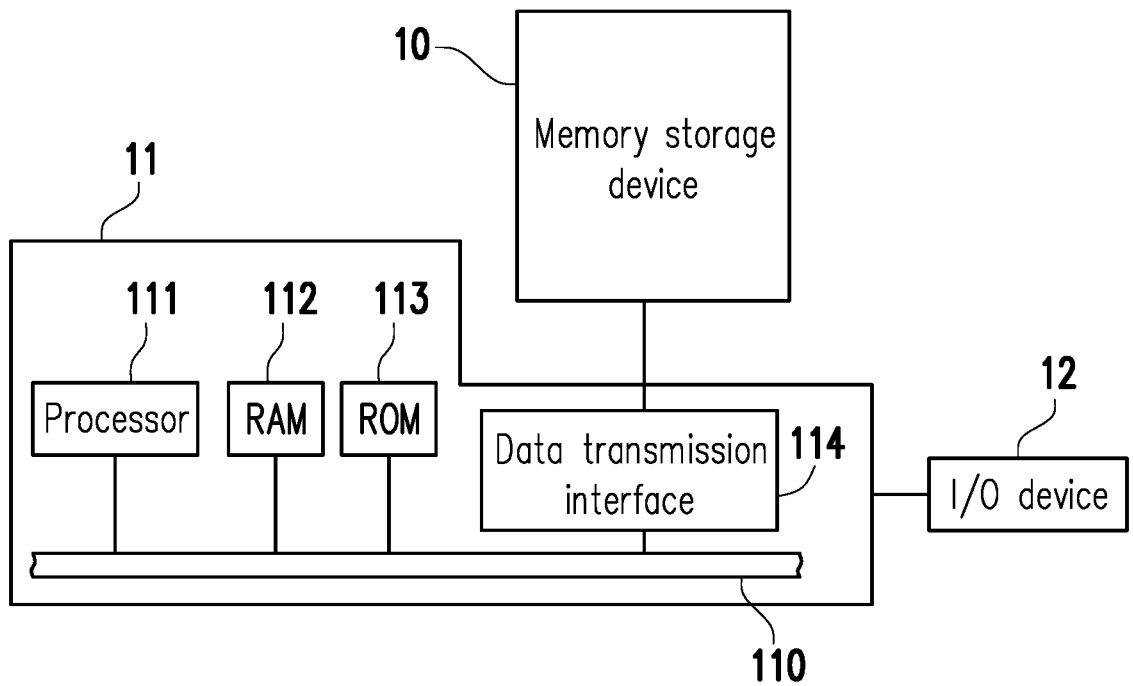
FIG. 1 is a schematic diagram illustrating a host system, a memory storage device and an I/O (input/output) device according to an exemplary embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the disclosure may comprise any one or more of the novel features described herein, including in the detailed description, and/or shown in the drawings. As used herein, "at least one," "one or more," and "and/or" are open-ended expressions that are both conjunctive and disjunctive in operation. For instance, each of the expressions "at least on of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

Figure 2:
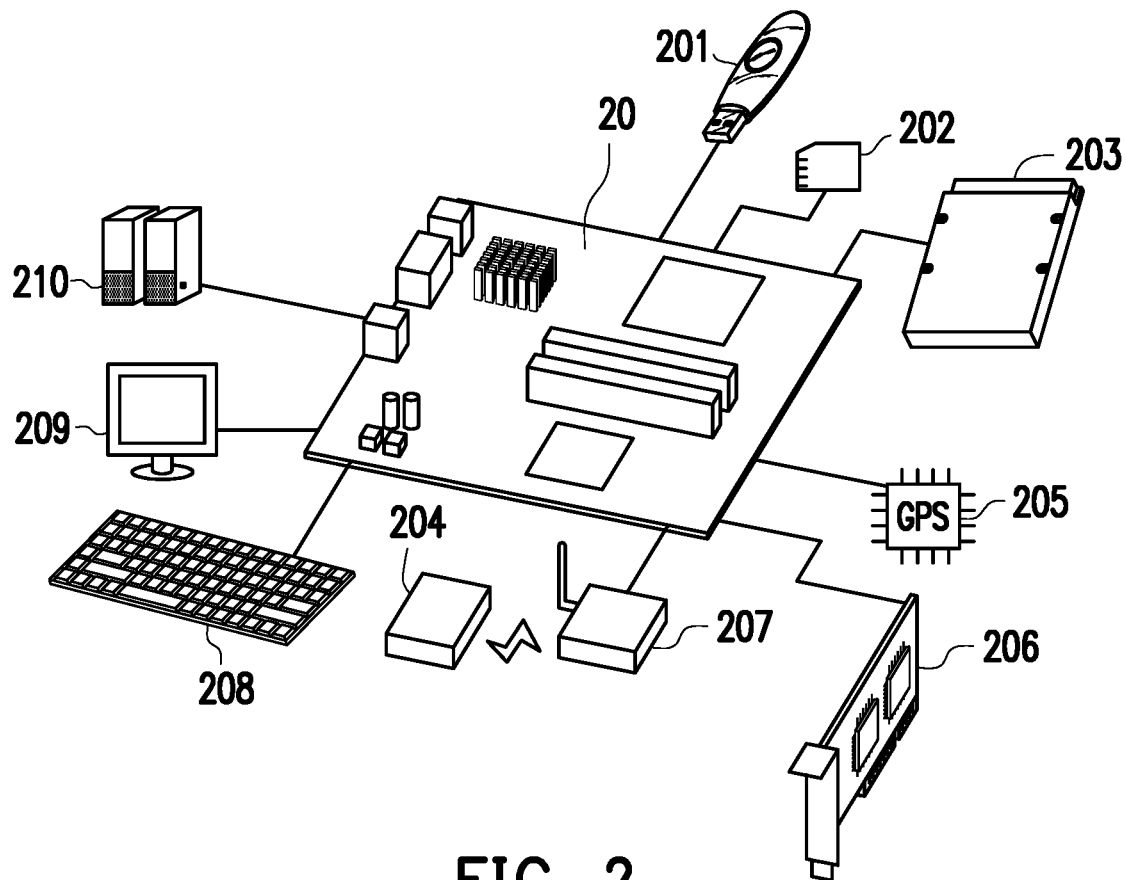
FIG. 2 is a schematic diagram illustrating a host system, a memory storage device and an I/O device according to another exemplary embodiment of the disclosure.

FIG. 1 is a schematic diagram illustrating a host system, a memory storage device and an I/O (input/output) device according to an exemplary embodiment of the disclosure. FIG. 2 is a schematic diagram illustrating a host system, a memory storage device and an I/O device according to another exemplary embodiment of the disclosure.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In this exemplary embodiment, the host system 11 is coupled to a memory storage device 10 through the data transmission interface 114. For example, the host system 11 can store data into the memory storage device 10 or read data from the memory storage device 10 via the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, an SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 via the wireless transmission device 207.

Figure 3:
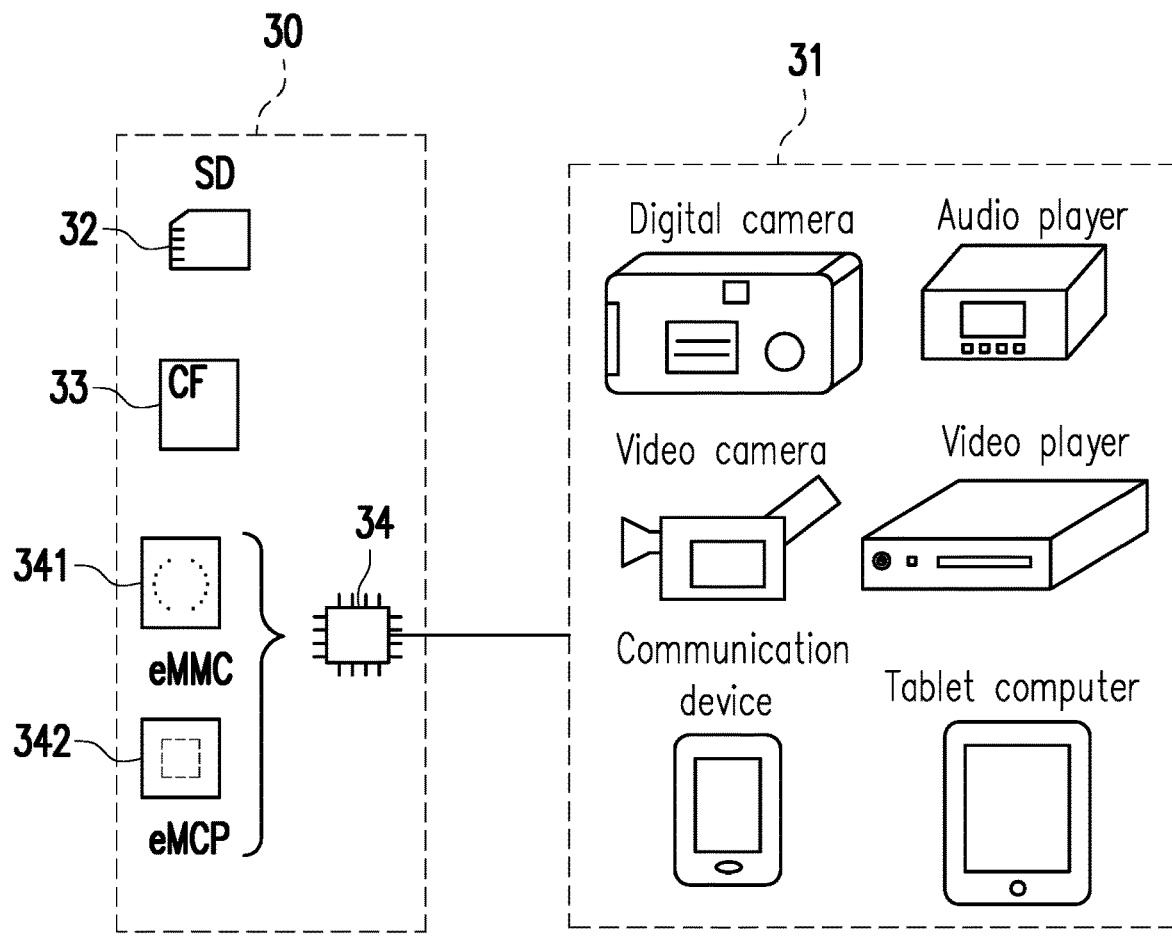
FIG. 3 is a schematic diagram illustrating a host system and a memory storage device according to another exemplary embodiment of the disclosure.

In an exemplary embodiment, aforementioned host system may be any system capable of substantially cooperating with the memory storage device for storing data. Although the host system is illustrated as a computer system in foregoing exemplary embodiment, nonetheless, FIG. 3 is a schematic diagram illustrating a host system and a memory storage device according to another exemplary embodiment of the disclosure. Referring to FIG. 3, in another exemplary embodiment, a host system 31 may also be a system including a digital camera, a video camera, a communication device, an audio player, a video player or a tablet computer, whereas a memory storage device 30 may be various non-volatile memory storage devices used by the host system, such as a SD card 32, a CF card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) 342.

Figure 4:
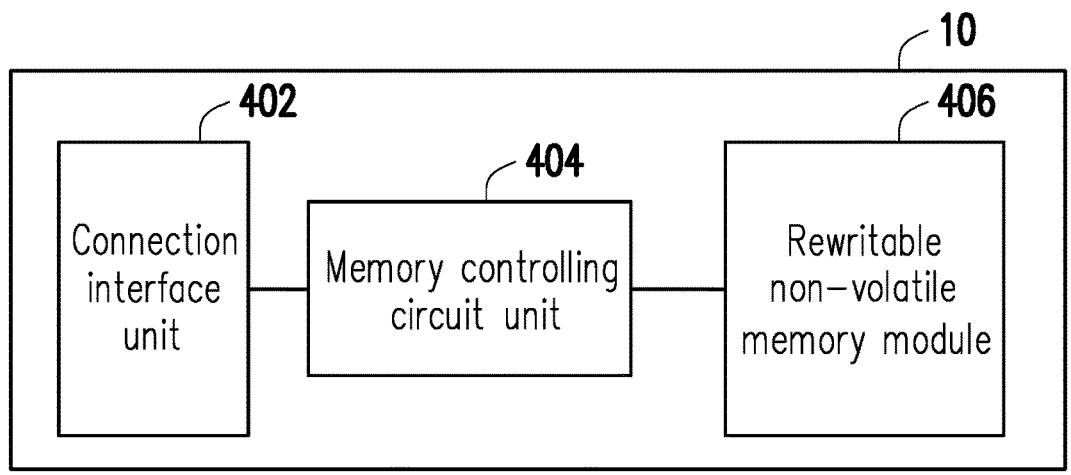
FIG. 4 is a schematic block diagram illustrating a memory storage device according to an exemplary embodiment of the disclosure.

FIG. 4 is a schematic block diagram illustrating a memory storage device according to an exemplary embodiment of the disclosure.

Referring to FIG. 4, the memory storage device 10 includes a connection interface unit 402, a memory controlling circuit unit 404 and a rewritable non-volatile memory module 406.

In the present exemplary embodiment, the connection interface unit 402 is compatible with a SATA (Serial Advanced Technology Attachment) standard. Nevertheless, it should be understood that the disclosure is not limited in this regard. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD (Secure Digital) interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. The connection interface unit 402 and the memory controlling circuit unit 404 may be packaged into one chip, or the connection interface unit 402 is distributed outside of a chip containing the memory controlling circuit unit 404.

The memory controlling circuit unit 404 is configured to execute a plurality of logic gates or control commands which are implemented in a hardware form or in a firmware form and perform operations of writing, reading or erasing data in the rewritable non-volatile memory storage module 406 according to the commands of the host system 11.

The rewritable non-volatile memory module 406 is coupled to the memory controlling circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

The memory cells in the rewritable non-volatile memory module 406 are disposed in an array. The memory cell array arranged in a two-dimensional array is taken as an example for description. However, it should be noted that, the following exemplary embodiment is simply an example of the memory cell array. In other exemplary embodiments, a disposition method of the memory cell array may be adjusted to satisfy actual requirements.

Figure 5:
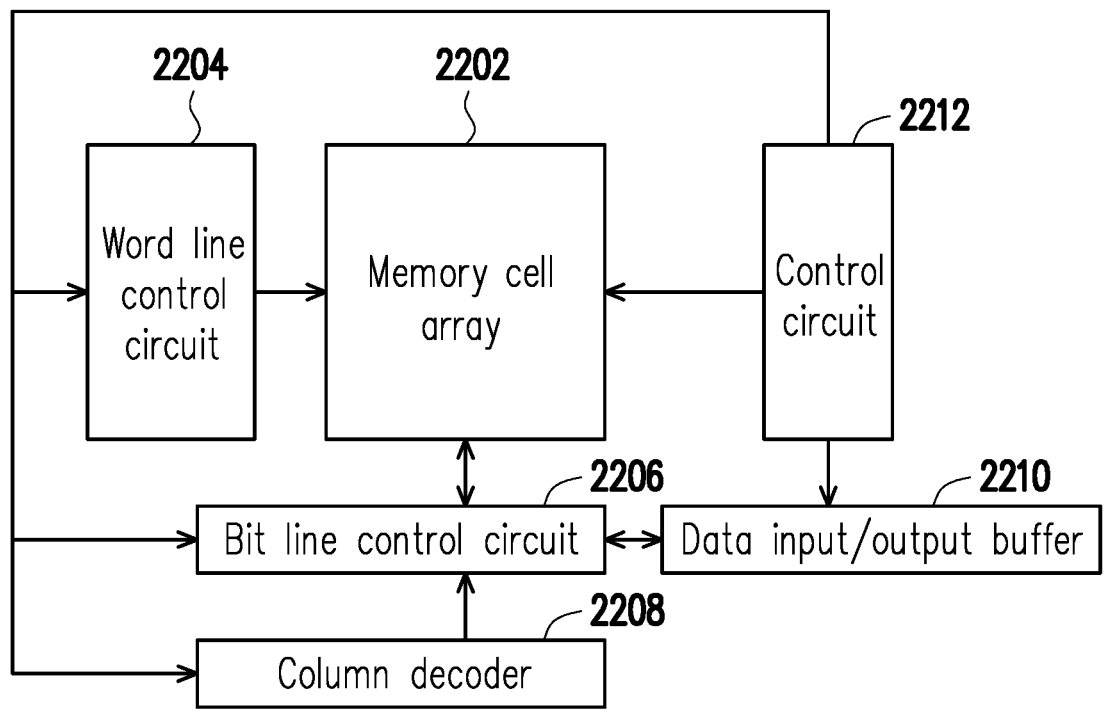
FIG. 5 is a schematic block diagram illustrating a rewritable non-volatile memory module according to an exemplary embodiment.
Figure 6:
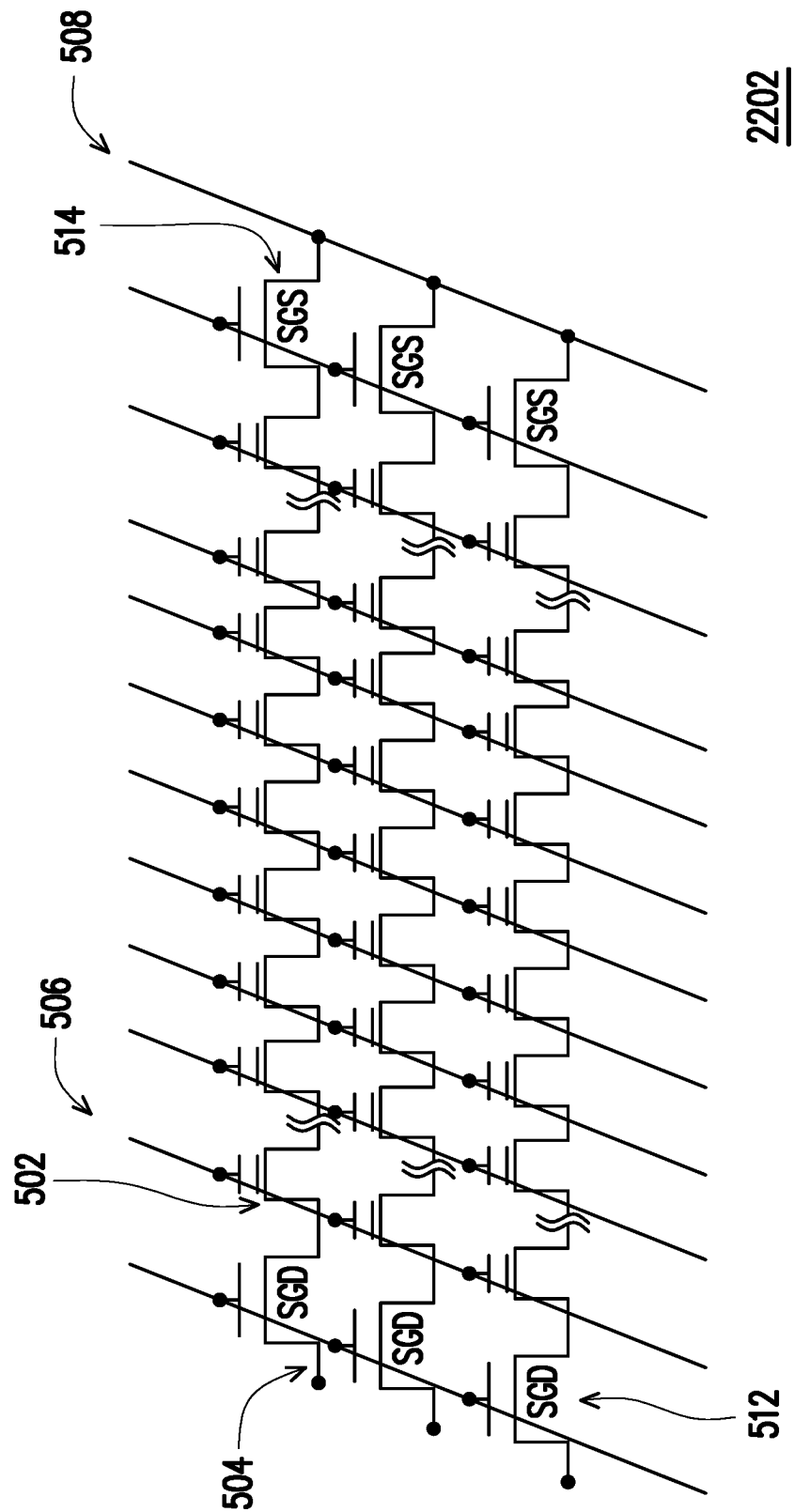
FIG. 6 is a schematic diagram illustrating a memory cell array according to an exemplary embodiment.

FIG. 5 is a schematic block diagram illustrating a rewritable non-volatile memory module according to an exemplary embodiment. FIG. 6 is a schematic diagram illustrating a memory cell array according to an exemplary embodiment.

Referring to FIG. 5 and FIG. 6 together, the rewritable non-volatile memory module 406 includes a memory cell array 2202, a word line control circuit 2204, a bit line control circuit 2206, a column decoder 2208, a data input/output buffer 2210 and a control circuit 2212.

In this exemplary embodiment, the memory cell array 2202 may include a plurality of memory cells 502 for storing data, a plurality of select gate drain (SGD) transistors 512 and a plurality of select gate source (SGS) transistors 514, as well as a plurality of bit lines 504, a plurality of word lines 506 and a common source line 508 connected to the memory cells (as shown in FIG. 6). The memory cells 502 are disposed at intersections of the bit lines 504 and the word lines 506 in a matrix manner (or in a 3D stacking manner). When a write command or a read command is received from the memory controlling circuit unit 404, the control circuit 2212 controls the word line control circuit 2204, the bit line control circuit 2206, the column decoder 2208, the data input-output buffer 2210 to write the data into the memory cell array 2202 or read the data from the memory cell array 2202, wherein the word line control circuit 2204 is configured to control voltages applied to the word lines 506, the bit line control circuit 2206 is configured to control voltages applied to the bit lines 504, the column decoder 2208 is configured to select the corresponding bit line according to a row address in a command, and the data input/output buffer 2210 is configured to temporarily store the data.

The memory cell in the rewritable non-volatile memory module 406 may store multiple bits by changing a threshold voltage of one memory cell. More specifically, in each of the memory cells, a charge trapping layer is provided between a control gate and a channel. Amount of electrons in the charge trapping layer may be changed by applying a write voltage to the control gate thereby changing the threshold voltage of the memory cell. This process of changing the threshold voltage is also known as "writing data into the memory cell" or "programming the memory cell". With the change of the threshold voltage, each of the memory cells in the memory cell array 2022 has a plurality of storage states. The storage state of the memory cell may be determined through a read voltage, so as to obtain the bits stored by the memory cell.

Figure 7:
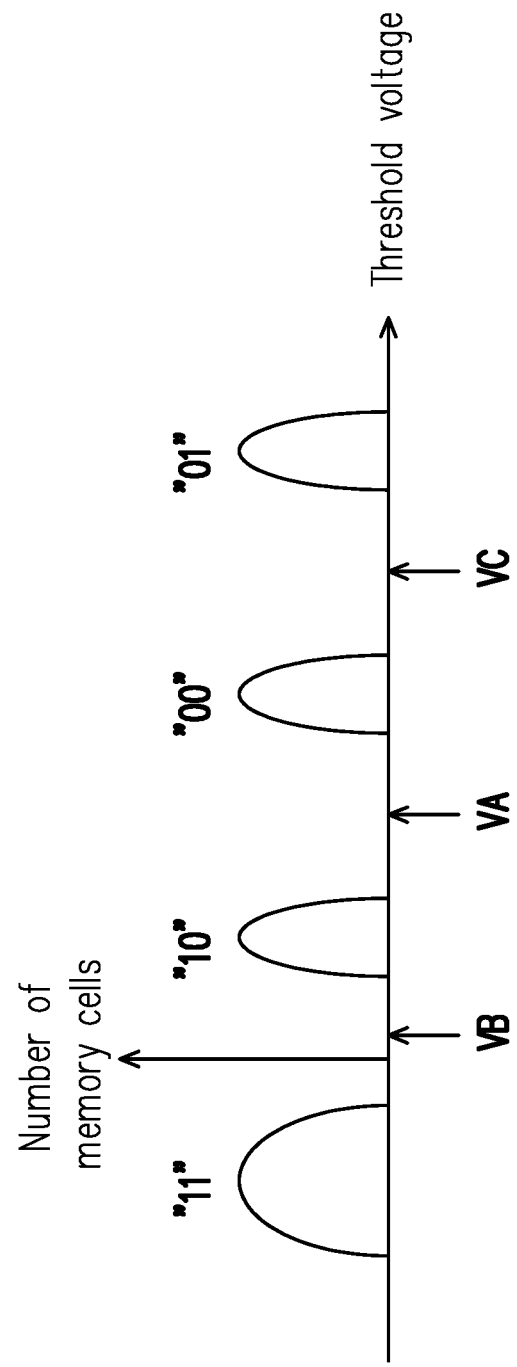
FIG. 7 is a histogram of a gate voltage corresponding to write data stored in the memory cell array according to an exemplary embodiment.

FIG. 7 is a histogram of a gate voltage corresponding to write data stored in the memory cell array according to an exemplary embodiment.

Figure 8:
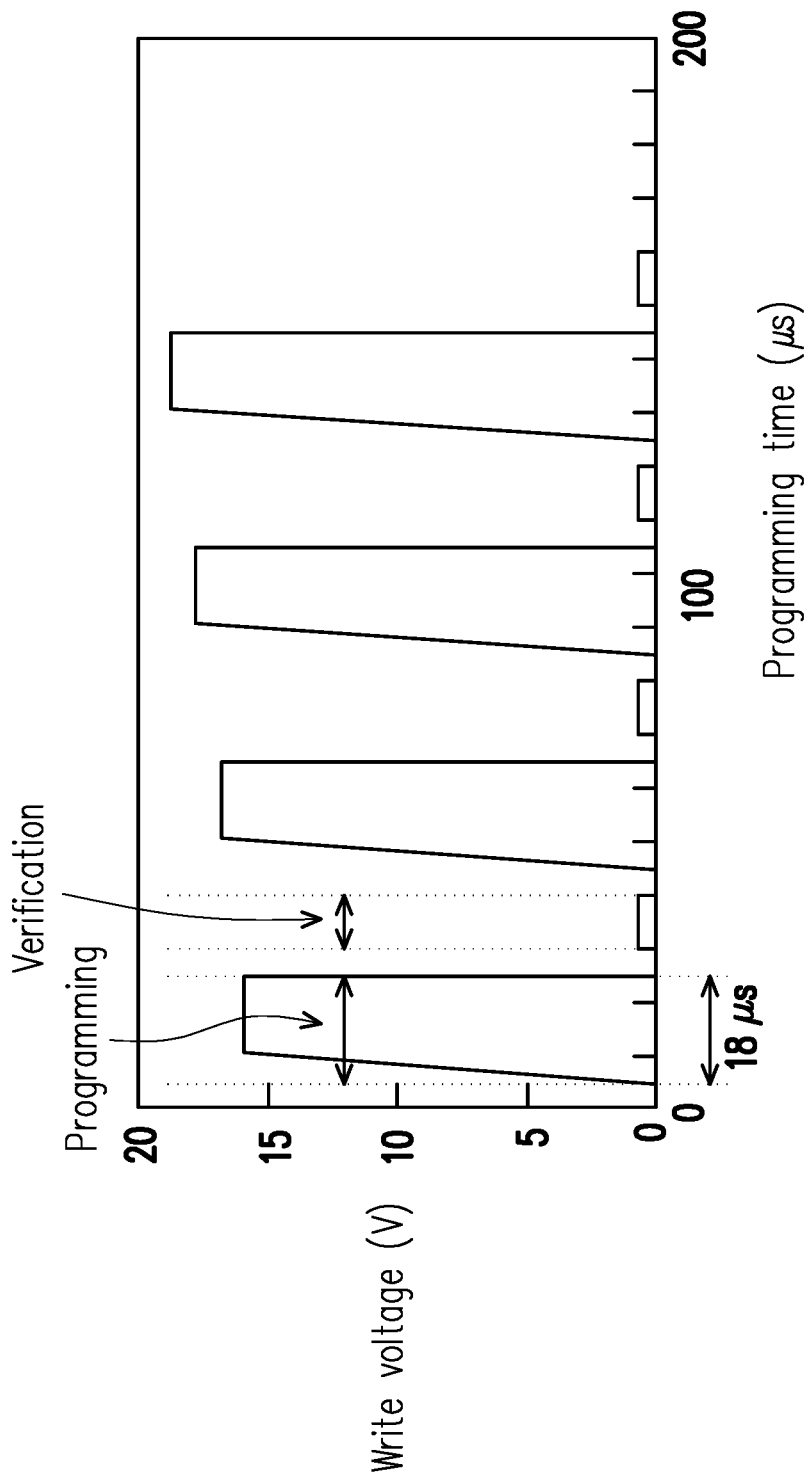
FIG. 8 illustrates a schematic diagram for programming a memory cell according to an exemplary embodiment.

Referring to FIG. 7, an MLC NAND flash memory is taken as an example for description, along with different threshold voltages, each memory cell has four storage states, and the storages states respectively represent bits of "11", "10", "00" and "01". In other words, each of the storage states includes a least significant bit (LSB) and a most significant bit (MSB). In this exemplary embodiment, among the storage states (i.e., "11", "10", "00" and "01"), a first bit counted from the left is the LSB, and a second bit counted from the left is the MSB. Accordingly, in this exemplary embodiment, each of the memory cells may store two bits. It should be understood that, the storage statuses corresponding to the threshold voltage as illustrated in the FIG. 8 are merely an example. In another exemplary embodiment of the disclosure, the correspondence between the threshold voltages and the storage states may also be an arrangement of "11", "10", "01" and "00" or other arrangement along with increase of the threshold voltage. Moreover, in another exemplary embodiment, it can also be defined that the first bit counted from the left is the MSB, and the second bit counted from the left is the LSB.

FIG. 8 illustrates a schematic diagram for programming a memory cell according to an exemplary embodiment.

Referring to FIG. 8, in this exemplary embodiment, a programming operation of the memory cell is implemented by using a method of pulse writing/verifying threshold voltage. Specifically, when data is to be written into a memory cell, the memory controlling circuit unit 404 implements a data writing operation by setting an initial write voltage and a write pulse time, and instructs the control circuit 2212 of the rewritable non-volatile memory module 406 to program the memory cell for reading data by using the set initial write voltage and the write pulse time. Then, the memory controlling circuit unit 404 applies a verification voltage to the control gate to determine whether the memory cell is conducted, thereby determining whether the memory cell is in a correct storage state (having a correct threshold voltage). If the memory cell is not programmed to the correct storage state, the memory controlling circuit unit 404 instructs the control circuit 2202 to use the currently-applied write voltage plus an Incremental-step-pulse programming (ISPP) adjusting value as a new write voltage and program the memory cell again by using the new write voltage and the write pulse time. Conversely, if the memory cell is programmed to the correct storage state, it means that the data is correctly written into the memory cell. For example, the initial voltage is set to 16 volts (V), the write pulse time is set to 18 microseconds (µs) and the ISPP adjusting value is set to 0.6V. However, the disclosure is not limited in this regard.

Figure 9:
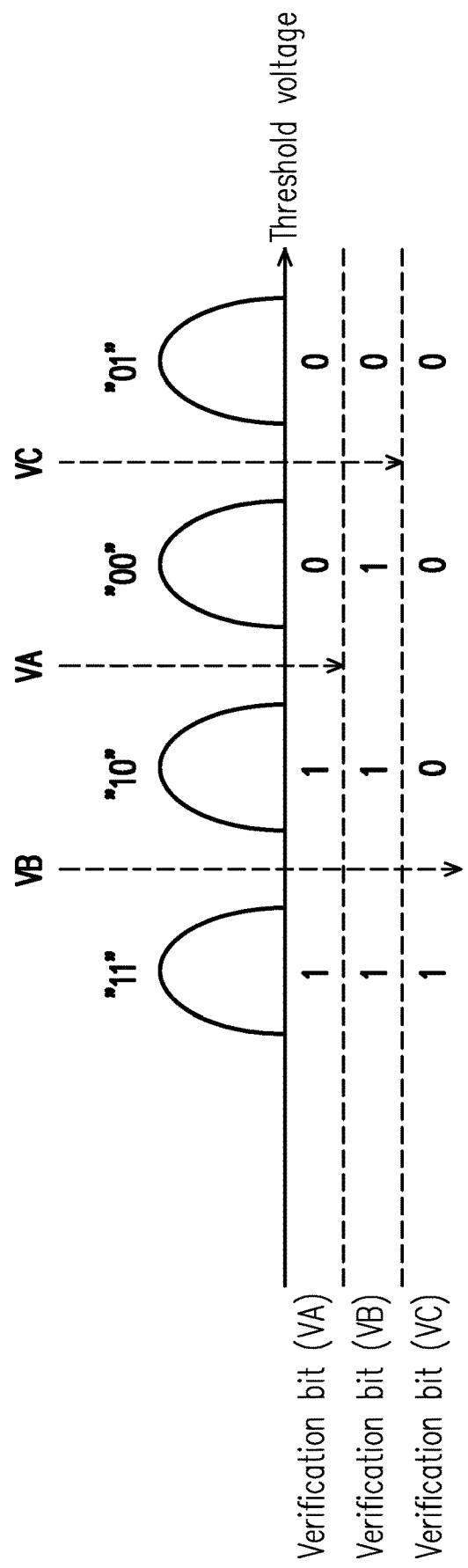
FIG. 9 illustrates a schematic diagram for reading data from a memory cell according to an exemplary embodiment.

FIG. 9 illustrates a schematic diagram of reading data from a memory cell according to an exemplary embodiment, which uses the MLC NAND flash memory for example.

Referring to FIG. 9, a reading operation for the memory cells of the memory cell array 2202 is implemented by applying a read voltage to the control gate, and identifying the data stored in the memory cell through a conduction state of the memory cell. A verification bit (VA) is configured to indicate whether the memory cell is conducted when a read voltage VA is applied; a verification bit (VB) is configured to indicate whether the memory cell is conducted when a read voltage VB is applied; a verification bit (VC) is configured to indicate whether the memory cell is conducted when a read voltage VC is applied. Here, it is assumed that the corresponding memory cell is conducted when the verification bit is "1", and the corresponding memory cell is not conducted when the verification bit is "0". As shown in FIG. 9, the storage states of the memory cell may be determined through the verification bits (VA) to (VC), so as to obtain the stored bits.

Figure 10:
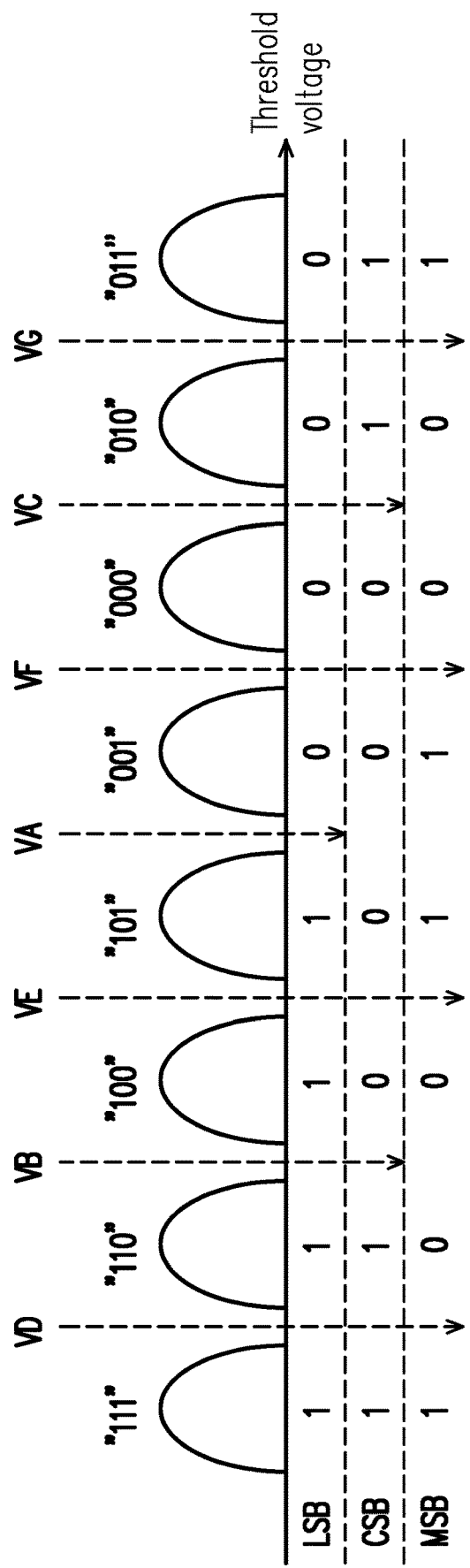
FIG. 10 illustrates a schematic diagram of reading data from a memory cell array according to another exemplary embodiment.

FIG. 10 illustrates a schematic diagram of reading data from a memory cell array according to another exemplary embodiment.

Referring to FIG. 10, a TLC NAND flash memory is taken as an example for description, each of the storages states includes the LSB of the first bit counted from the left, a center significant bit (CSB) of the second bit counted from the left and the MSB of a third bit counted from the left. In this example, according to different threshold voltages, the memory cell has 8 storage states (i.e., "111", "110", "100", "101", "001", "000", "010" and "011"). The bits stored in the memory cell may be identified by applying the read voltages VA to VC to the control gate.

Figure 11:
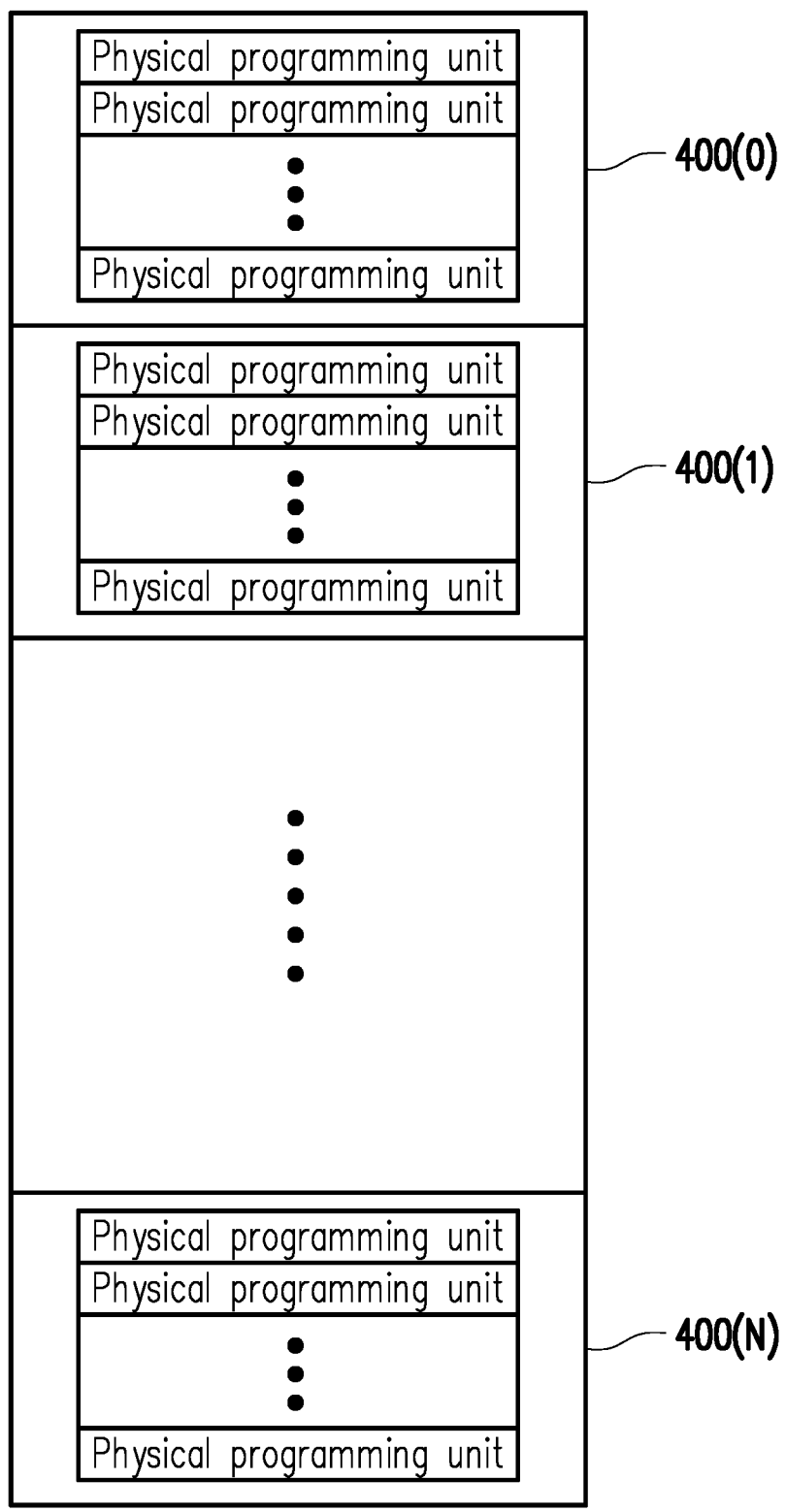
FIG. 11 is a schematic diagram illustrating management of a rewritable non-volatile memory module according to an exemplary embodiment of the disclosure.

FIG. 11 is a schematic diagram illustrating management of a rewritable non-volatile memory module according to an exemplary embodiment of the disclosure.

Referring to FIG. 11, the memory cells 502 of the rewritable non-volatile memory module 406 constitute a plurality of physical programming units, and the physical programming units constitute a plurality of physical erasing units 400(0) to 400(N). Specifically, the memory cells on the same word line constitute one or more of the physical programming units. If each of the memory cells can store more than two bits, the physical programming units on the same word line can be classified into a lower physical programming unit and an upper physical programming unit. For instance, the LSB of each memory cell is the lower physical programming unit, and the MSB of each memory cell is the upper physical programming unit. In this exemplary embodiment, the physical programming unit is the minimum unit for programming. That is, the physical programming unit is the minimum unit for writing data. For example, the physical programming unit is a physical page or a physical sector. When the physical programming unit is the physical page, each physical programming unit usually includes a data bit area and a redundancy bit area. The data bit area has multiple physical sectors configured to store user data, and the redundant bit area is configured to store system data (e.g., the error correcting code). In the present exemplary embodiment, each of the data bit areas contains 32 physical sectors, and a size of each physical sector is 512-byte (B). However, in other exemplary embodiments, the data bit area may also include 8, 16, or more or less physical sectors, and the disclosure is not intended to limit the size and number of the physical sectors. On the other hand, the physical erasing unit is the minimum unit for erasing. That is, each physical erasing unit contains the least number of memory cells to be erased together. For instance, the physical erasing unit is a physical block.

Figure 12:
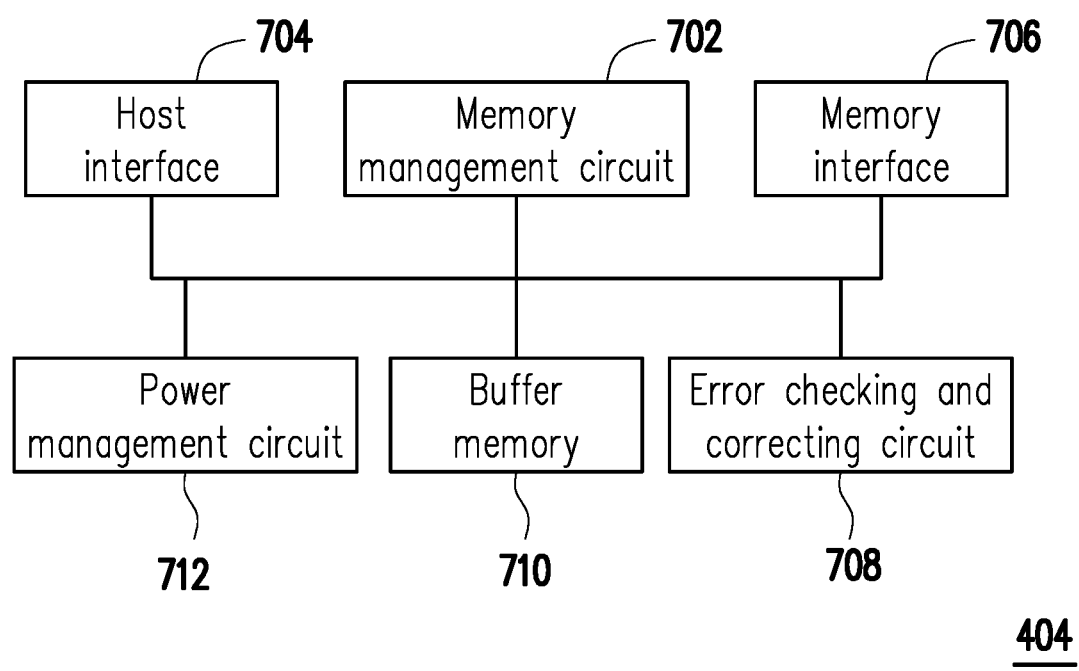
FIG. 12 is a schematic block diagram illustrating a memory controlling circuit unit according to an exemplary embodiment.

FIG. 12 is a schematic block diagram illustrating a memory controlling circuit unit according to an exemplary embodiment. It should be understood that, the structure of the memory controlling circuit unit depicted in FIG. 12 is only an example, and the disclosure is not limited thereto.

Referring to FIG. 12, the memory controlling circuit unit 404 includes a memory management circuit 702, a host interface 704, a memory interface 706 and an error checking and correcting circuit 708.

The memory management circuit 702 is configured to control overall operations of the memory controlling circuit unit 404. Specifically, the memory management circuit 702 has a plurality of control commands. When the memory storage device 10 operates, the control commands are executed to perform various operations such as data writing, data reading and data erasing. Hereinafter, description regarding operations of the memory management circuit 702 or any circuit element in the memory controlling circuit unit 404 is equivalent to description regarding operations of the memory controlling circuit unit 404.

In this exemplary embodiment, the control commands of the memory management circuit 702 are implemented in form of firmware. For instance, the memory management circuit 702 has a microprocessor unit (not illustrated) and a ROM (not illustrated), and the control commands are burned into the ROM. When the memory storage device 10 operates, the control commands are executed by the microprocessor to perform operations of writing, reading or erasing data.

In another exemplary embodiment, the control commands of the memory management circuit 702 may also be stored as program codes in a specific area (e.g., the system area in a memory exclusively used for storing system data) of the rewritable non-volatile memory module 406. In addition, the memory management circuit 702 has a microprocessor unit (not illustrated), a ROM (not illustrated) and a RAM (not illustrated). More particularly, the ROM has a boot code, which is executed by the microprocessor unit to load the control commands stored in the rewritable non-volatile memory module 406 to the RAM of the memory management circuit 702 when the memory controlling circuit unit 404 is enabled. Then, the control commands are executed by the microprocessor unit to perform operations, such as writing, reading or erasing data.

Further, in another exemplary embodiment, the control commands of the memory management circuit 702 may also be implemented in form of hardware. For example, the memory management circuit 702 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or a group thereof. The memory writing circuit is configured to issue a write command sequence for the rewritable non-volatile memory module 406 to write data into the rewritable non-volatile memory module 406. The memory reading circuit is configured to issue a read command sequence for the rewritable non-volatile memory module 406 to read data from the rewritable non-volatile memory module 406. The memory erasing circuit is configured to issue an erase command sequence for the rewritable non-volatile memory module 406 to erase data from the rewritable non-volatile memory module 406. The data processing circuit is configured to process data to be written into the rewritable non-volatile memory module 406 and data read from the rewritable non-volatile memory module 406. Each of the write command sequence, the read command sequence and the erase command sequence may include one or more program codes or command codes and instruct the rewritable non-volatile memory module 406 to execute the corresponding operations, such as writing, reading and erasing. In an exemplary embodiment, the memory management circuit 702 may further give command sequence of other types to the rewritable non-volatile memory module 406 for instructing to perform the corresponding operations.

The host interface 704 is coupled to the memory management circuit 702 and configured to receive and identify commands and data sent from the host system 11. In other words, the commands and data transmitted by the host system 11 are transmitted to the memory management circuit 702 via the host interface 704. In this exemplary embodiment, the host interface 704 is compatible with the SATA standard. Nevertheless, it should be understood that the disclosure is not limited in this regard. The host interface 704 may also compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 706 is coupled to the memory management circuit 702 and configured to access the rewritable non-volatile memory module 406. In other words, data to be written into the rewritable non-volatile memory module 406 is converted into a format acceptable by the rewritable non-volatile memory module 406 via the memory interface 706. Specifically, if the memory management circuit 702 intends to access the rewritable non-volatile memory module 406, the memory interface 706 sends corresponding command sequences. For example, the command sequences may include the write command sequence as an instruction for writing data, the read command sequence as an instruction for reading data, the erase command sequence as an instruction for erasing data, and other corresponding command sequences as instructions for performing various memory operations (e.g., changing read voltage levels or performing a garbage collection procedure). These command sequences are generated by the memory management circuit 702 and transmitted to the rewritable non-volatile memory module 406 via the memory interface 706, for example. The command sequences may include one or more signals, or data transmitted in the bus. The signals or the data may include command codes and program codes. For example, information such as identification codes and memory addresses are included in the read command sequence;

The error checking and correcting circuit 708 is coupled to the memory management circuit 702 and configured to perform an error checking and correcting operation to ensure integrity of data. Specifically, when the memory management circuit 702 receives the write command from the host system 11, the error checking and correcting circuit 708 generates the error correcting code (ECC) or the error detecting code (EDC) for data corresponding to the write command, and the memory management circuit 702 writes data and the ECC or the EDC corresponding to the write command into the rewritable non-volatile memory module 406. Then, when the memory management circuit 702 reads the data from the rewritable non-volatile memory module 406, the corresponding ECC and/or the EDC are also read, and the error checking and correcting circuit 708 performs the error checking and correcting operation on the read data based on the ECC and/or the EDC.

In an exemplary embodiment of the disclosure, the memory controlling circuit unit 404 further includes a buffer memory 710 and a power management circuit 712. The buffer memory 710 is coupled to the memory management circuit 702 and configured to temporarily store data and commands from the host system 11 or data from the rewritable non-volatile memory module 406. The power management unit 712 is coupled to the memory management circuit 702 and configured to control a power of the memory storage device 100.

Figure 13:
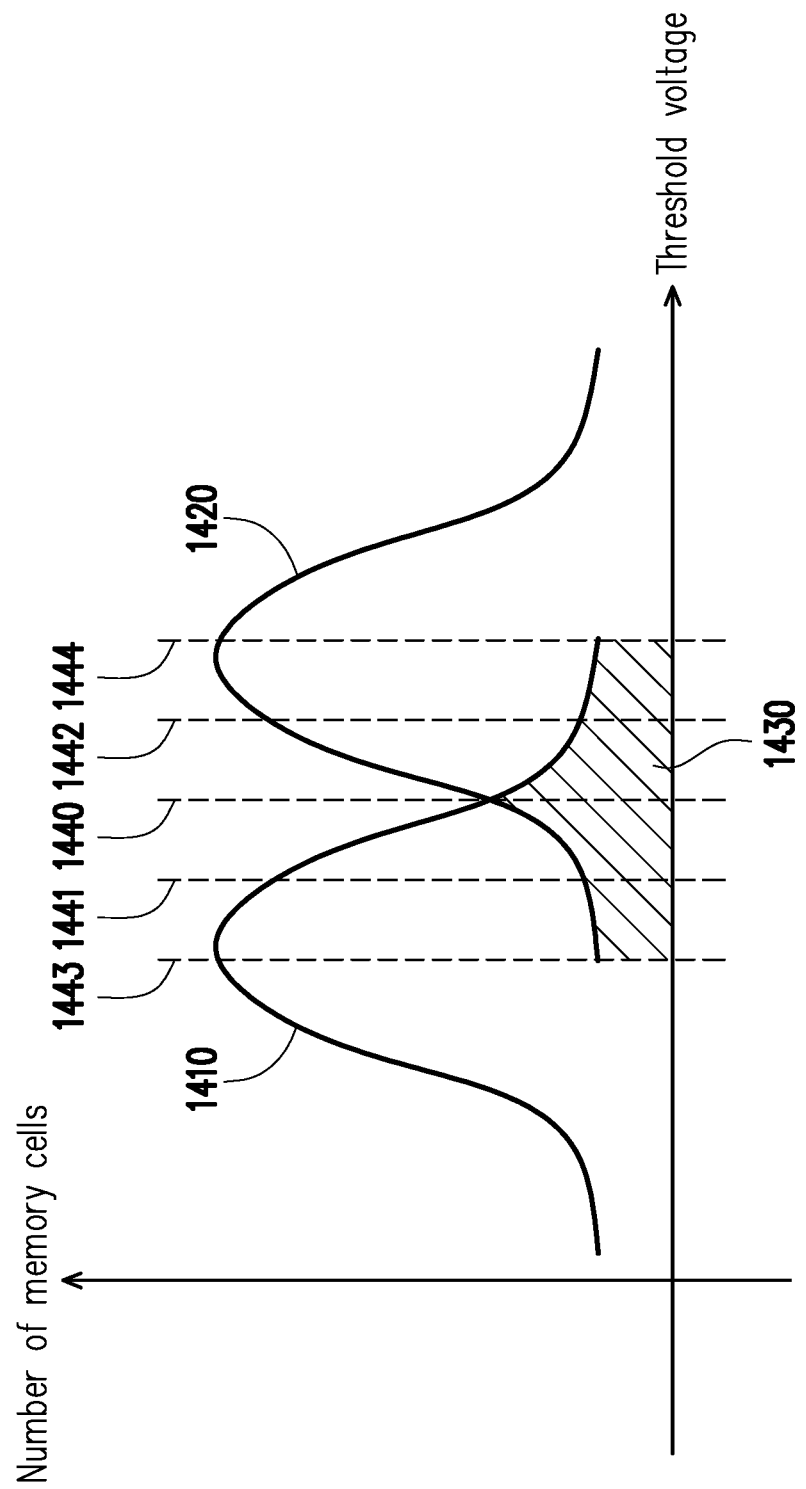
FIG. 13 is a schematic diagram illustrating a hard bit mode decoding according to an exemplary embodiment.

FIG. 13 is a schematic diagram illustrating a hard bit mode decoding according to an exemplary embodiment.

Referring to FIG. 13, an SLC flash memory is taken as an example for description, a distribution 1410 and a distribution 1420 are used for representing storage states of a plurality of first memory cells, and the distribution 1410 and the distribution 1420 respectively represents different storage states. These first memory cells may belong to the same physical programming unit or different physical programming units, and the disclosure is not limited thereto. Here, it is assumed that when one memory cell belongs to the distribution 1410, the bit stored by that memory cell is "1"; and when one memory cell belongs to the distribution 1420, the bit stored by that memory cell is "0". When the memory management circuit 702 uses a read voltage 1440 to read the memory cell, the memory management circuit 702 would obtain a verification bit, which is used to indicate whether that memory cell is turned on. Here, it is assumed that the verification bit is "1" when the memory cell is turned on, otherwise it is "0", but the disclosure is not limited thereto. If the verification bit is "1", the memory management circuit 702 determines that this memory cell belongs to distribution 1410, and belongs to the distribution 1420 otherwise. The distribution 1410 and the distribution 1420 overlap with each other in a region 1430. Namely, some memory cells belonging to the distribution 1410 are recognized as belonging to the distribution 1420, and some memory cells belonging to the distribution 1420 are recognized as belonging to the distribution 1410.

In this exemplary embodiment, when these first memory cells are to be read, the memory management circuit 702 selects a read voltage (e.g., a read voltage 1441) to read the first memory cells to obtain the verification bits of the first memory cells. The error check and correction circuit 708 performs a decoding operation (a.k.a. a first decoding operation) containing a probability decoding algorithm according to the verification bits of the first memory cells to generate a plurality of decoding bits, and the decoding bits may construct a codeword.

In this exemplary embodiment, the probability decoding algorithm is to take a possible decoding result of a symbol as a candidate, and information input during the decoding process or values of an intermediate operation process are indicated by probabilities of the candidates or a ratio of probabilities between the candidates, so as to determine the most possible candidate. For example, if one symbol has two candidates (bits 0 and 1), the probability decoding algorithm is to calculate the most possible candidate according to occurrence probabilities of 0 or 1, or calculate the most possible candidate according to a probability ratio between 0 and 1. It is assumed that there are N candidates, for example, possible values are 0 to N-1 (N is a positive integer, and each candidate represents multiple bits) under a finite field, the probability decoding algorithm is to respectively calculate the probabilities of the N candidates to determine the most possible candidate, or take the probability of one of the values as a denominator to calculate a relative probability ratio to determine the most possible candidate. In an exemplary embodiment, the aforementioned probability ratio may be represented in form of logarithm.

In this exemplary embodiment, the probability decoding algorithm may also be a convolutional code, a turbo code, a low-density parity-check code or other algorithms with probability decoding features. For instance, in the convolutional code and the turbo code, a finite state machine may be applied for encoding and decoding, and the most possible states may be calculated according to the verification bits in this exemplary embodiment, so as to generate the decoding bits. The low-density parity-check code is taken as an example for description.

If the low-density parity-check code is used, when the first decoding operation is performed according to the verification bits, the memory management circuit 702 further obtains a decoding initial value of each memory cell according to each of the verification bits. For example, if the verification bit is "1", the memory management circuit 702 sets the decoding initial value of the corresponding memory cell to n; and if the verification bit is "0", the decoding initial value is −n. Here, n is a positive integer. However, the value of the positive integer n is not particularly limited by the disclosure. In an embodiment, n is, for example, 8.

Then, the error checking and correcting circuit 708 performs an iterative decoding of the low-density parity-check algorithm according to the decoding initial values to generate a codeword including a plurality of decoding bits. In the iterative decoding, the decoding initial values are continuously updated to represent a probability, and the probability is also referred to as a reliability or a belief. The updated decoding initial values may be converted into a plurality of decoding bits, and the error checking and correcting circuit 708 may take the decoding bits as a vector, and multiply the vector with a module 2 matrix of a parity-check matrix of the low-density parity-check algorithm, so as to obtain a plurality of syndromes. The syndromes may be used for determining whether the codeword composed of the decoding bits is a valid codeword. If the codeword composed of the decoding bits is the valid codeword, the iterative decoding is stopped, and the error checking and correcting circuit 708 outputs the codeword composed of the decoding bits. If the codeword composed of the decoding bits is an invalid codeword, the decoding initial values are continually updated to generate new decoding bits to perform a next iteration. When the number of iterations reaches a predetermined iteration times, the iterative decoding is stopped. The error checking and correcting circuit 708 determines whether a decoding is successful by using the decoding bits generated by the last iteration. For example, if it is determined that the decoding bits generated by the last iteration constitute the valid codeword according to the syndromes, the decoding is successful; and if the decoding bits constitute the invalid codeword, it means that the decoding is failed.

In another exemplary embodiment, the probability decoding algorithm included in the decoding operation is the convolutional code and the turbo code, and the decoding operation further includes other error correcting codes. For example, the convolutional code and the turbo code may be used in collaboration with a parity code of any algorithm. In the decoding operation, after execution of the decoding part of the convolutional code or the turbo code is completed, the parity code may be used for determining whether the codeword composed of the generated decoding bits is the valid codeword, so as to determine whether the decoding is successful.

Regardless of the type of the used error correcting code, if the decoding is failed, it means that the first memory cells store uncorrectable error bits. If the decoding is failed, the memory management circuit 702 re-obtains another read voltage, and uses the another read voltage (e.g., a read voltage 1442) to read the first memory cells, so as to re-obtain the verification bits of the memory cells. The memory management circuit 702 performs the first decoding operation according to the re-obtained verification bits to obtain another codeword composed of a plurality of decoding bits. In an exemplary embodiment, the error checking and correcting circuit 708 determines whether the another codeword is a valid codeword according to the syndromes corresponding to the another codeword. If the another codeword is not the valid codeword, the memory management circuit 702 determines that the decoding is failed. If the number of times of re-obtaining the read voltage is not greater than a preset number of times, the memory management circuit 702 re-obtains other read voltage (e.g., a read voltage 1443), and reads the first memory cells according to the re-obtained read voltage 1443, so as to re-obtain the verification bits and perform the first decoding operation.

In other words, if there are the uncorrectable error bits, by re-obtaining the read voltage, the verification bits of some memory cells are changed, so as to change some probabilities in the probability decoding algorithm, and it accordingly has a chance to change the decoding result of the decoding operation. Logically, the operation of re-obtaining the read voltage is required to flip some bits in one codeword, and re-decode the new codeword. In certain cases, the codeword that is undecodable before the flip (there are the uncorrectable error bits) may become decodable after the flip. Also, in an exemplary embodiment, the memory management circuit 702 would attempt the decoding several times until the number of attempts exceeds the preset number of times. Nevertheless, the disclosure is not intended to limit the preset number of times.

It should be noted that, although the SLC flash memory is used as the example in FIG. 13, the steps of re-obtaining the read voltage are also applicable to the MLC or TLC flash memories. As shown by FIG. 9, changing a read voltage VA would require flipping the LSB of one memory cell, and changing read voltage VB or VC would require flipping the MSB of one memory cell. Therefore, changing the read voltage VA, VB or VC can change one codeword to another codeword. The result of changing the codeword is also applicable to the TLC flash memory of FIG. 10. The disclosure is not limited to the use of SLC, MLC or TLC flash memory.

In the exemplary embodiment of FIG. 13, the decoding initial values of the memory cells are divided into two values (e.g., n and −n) according to one verification bit. The iterative decoding executed according to the two values is also referred to as the iterative decoding in a hard bit mode. However, the step of changing the read voltage may also be applied to the iterative decoding in a soft bit mode, where the decoding initial values of each memory cell are determined according to a plurality of verification bits. It should be noted that regardless of the hard bit mode or the soft bit mode, the probabilities of the bits are calculated in the iterative decoding, so that the hard bit mode or the soft bit mode all belong to the probability decoding algorithm.

Figure 14:
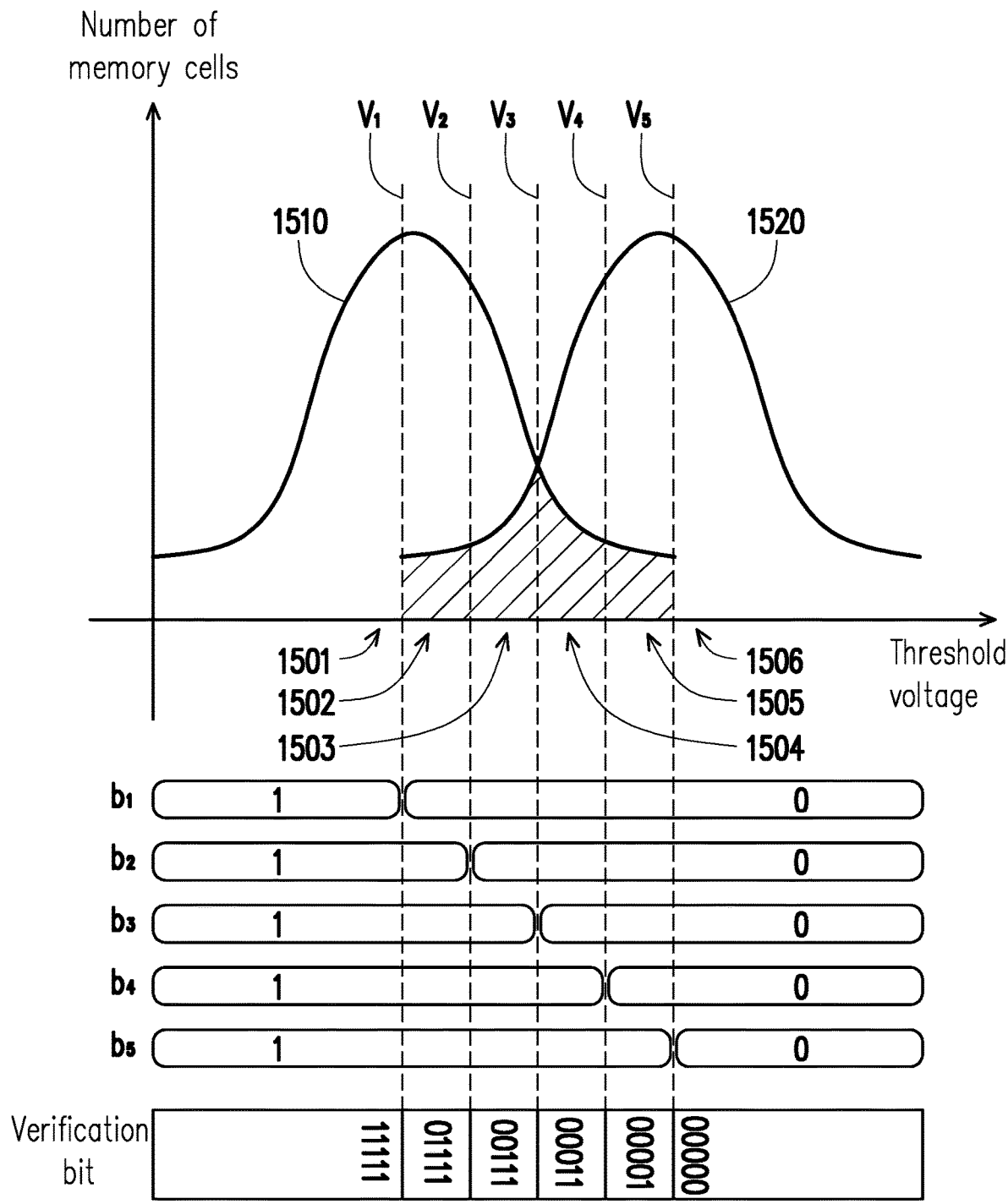
FIG. 14 is a schematic diagram illustrating a soft bit mode decoding according to an exemplary embodiment.

FIG. 14 is a schematic diagram illustrating a soft bit mode decoding according to an exemplary embodiment.

As described above, after a read voltage is applied to the control gate of the memory cell, the verification bit obtained by the memory management circuit 702 may be "0" or "1" depending on whether the memory cell is turned on. Herein, it is assumed that the corresponding verification bit is "0" when the memory cell is not turned on, otherwise, it is "1". In FIG. 14, the memory management circuit 702 applies read voltages V1 to V5 to the memory cells to obtain 5 verification bits. Specifically, the read voltage V1 corresponds to a verification bit b1; the read voltage V2 corresponds to a verification bit b2; the read voltage V3 corresponds to a verification bit b3; the read voltage V4 corresponds to a verification bit b4; the read voltage V5 corresponds to a verification bit b5. If a threshold voltage of one memory cell is within an interval 1501, starting from the verification bit b1 to the verification bit b5, the verification bits obtained by the memory management circuit 702 are "11111"; if the threshold voltage of the memory cell is within an interval 1502, the verification bits are "01111"; if the threshold voltage of the memory cell is within an interval 1503, the verification bits are "00111"; if the threshold voltage of the memory cell is within an interval 1504, the verification bits are "00011"; if the threshold voltage of the memory cell is within an interval 1505, the verification bits are "00001"; if the threshold voltage of the memory cell is within an interval 1506, the verification bits are "00000".

In this exemplary embodiment, one of the read voltages V1 to V5 is set to a plus-minus sign read voltage. The plus-minus sign read voltage is used to determine a plus-minus sign of a decoding initial value. For example, if the read voltage V3 is the plus-minus sign read voltage, the decoding initial values corresponding to the intervals 1501 to 1503 are smaller than 0, and the decoding initial values corresponding to the intervals 1504 to 1506 are greater than 0. Further, in each of the intervals, a probability of the memory cell belonging to a distribution 1510 and a probability of the memory cell belonging to a distribution 1520 may be calculated in advance. A log likelihood ratio (LLR) value may be calculated according to said two probabilities. The LLR value may be used to decide a size of an absolute value of the decoding initial value. Accordingly, the memory management circuit 702 obtains the decoding initial values of the memory cells in the soft bit mode according to the plus-minus sign read voltage and the verification bits b1 to b5. For instance, the decoding initial values corresponding to the intervals 1501 to 1503 may respectively be −8, −4 and −3 and the decoding initial values corresponding to the intervals 1504 to 1506 may respectively be 3, 4 and 8. In an exemplary embodiment, the decoding initial value corresponding to each of the intervals may be calculated and stored in a lookup table in advance. The memory management circuit 702 may input the verification bits b1 to b5 to the lookup table, so as to obtain the corresponding decoding initial values. In other words, practically, the memory management circuit 702 may also obtain the decoding initial values of the memory cells in the soft bit mode according to the verification bits b1 to b5 without referring to the plus-minus sign read voltage. In addition, if different plus-minus sign voltages are set, the memory management circuit 702 may then use different lookup tables.

After the decoding initial values are obtained by the memory management circuit 702, the error checking and correcting circuit 708 performs the iterative decoding on the decoding initial values to obtain a codeword composed of a plurality of decoded bits, and uses the codeword composed of the decoded bits to determine whether the decoding is successful. If the decoding is failed, the memory management circuit 702 may re-obtain another read voltage.

Because the log likelihood ratio corresponding to each interval changes after said another read voltage is re-obtained, the memory management circuit 702 uses a different lookup list to obtain the decoding initial values. Logically, changing the read voltage is to flip certain bits in one codeword and give different decoding initial values (by changing the value or the plus-minus sign), so that the codeword that is undecodable before changing (with uncorrectable error bit) becomes decodable after changing.

In the exemplary embodiment of FIG. 14, the decoding initial values for the soft bit mode decoding are determined according to the 5 verification bits (the read voltages). However, in other exemplary embodiments, the decoding initial values for the soft bit mode decoding may also be determined by more or less verification bits, and the disclosure is not limited thereto.

Nonetheless, it should be noted that, in general, the memory management circuit 702 normally writes a data from the host system and the ECC or EDC corresponding to the data into the same physical programming unit of the rewritable non-volatile memory module 406. However, when decoding the data stored in the physical programming unit with a lower reliability, there is a higher probability of the decoding failure regardless of whether it is the hard bit mode decoding or the soft bit mode decoding.

Therefore, the disclosure provides a data writing method, a memory controlling circuit unit and a memory storage device that can effectively decode the data stored in the physical programming unit with the lower reliability to increase the probability of successful decoding.

Figure 15:
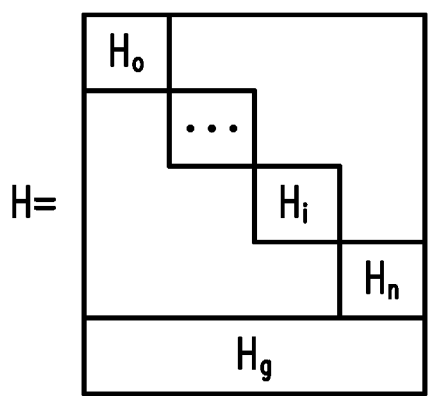
FIG. 15 is a schematic diagram illustrating a parity check matrix according to an exemplary embodiment.

FIG. 15 is a schematic diagram illustrating a parity check matrix according to an exemplary embodiment.

Referring to FIG. 15, in this embodiment, the memory management circuit 702 sets a matrix H in advance. The matrix H includes sub-matrices $H_i$ and an additional matrix $H_g$, wherein i is a positive integer greater than or equal to 0 and less than or equal n. In the matrix H, values other than those of the sub-matrices $H_i$ and the additional matrix $H_g$ may be set to 0. The disclosure is not intended to limit sizes of the sub-matrices $H_i$ and the additional matrix $H_g$.

Figure 16:
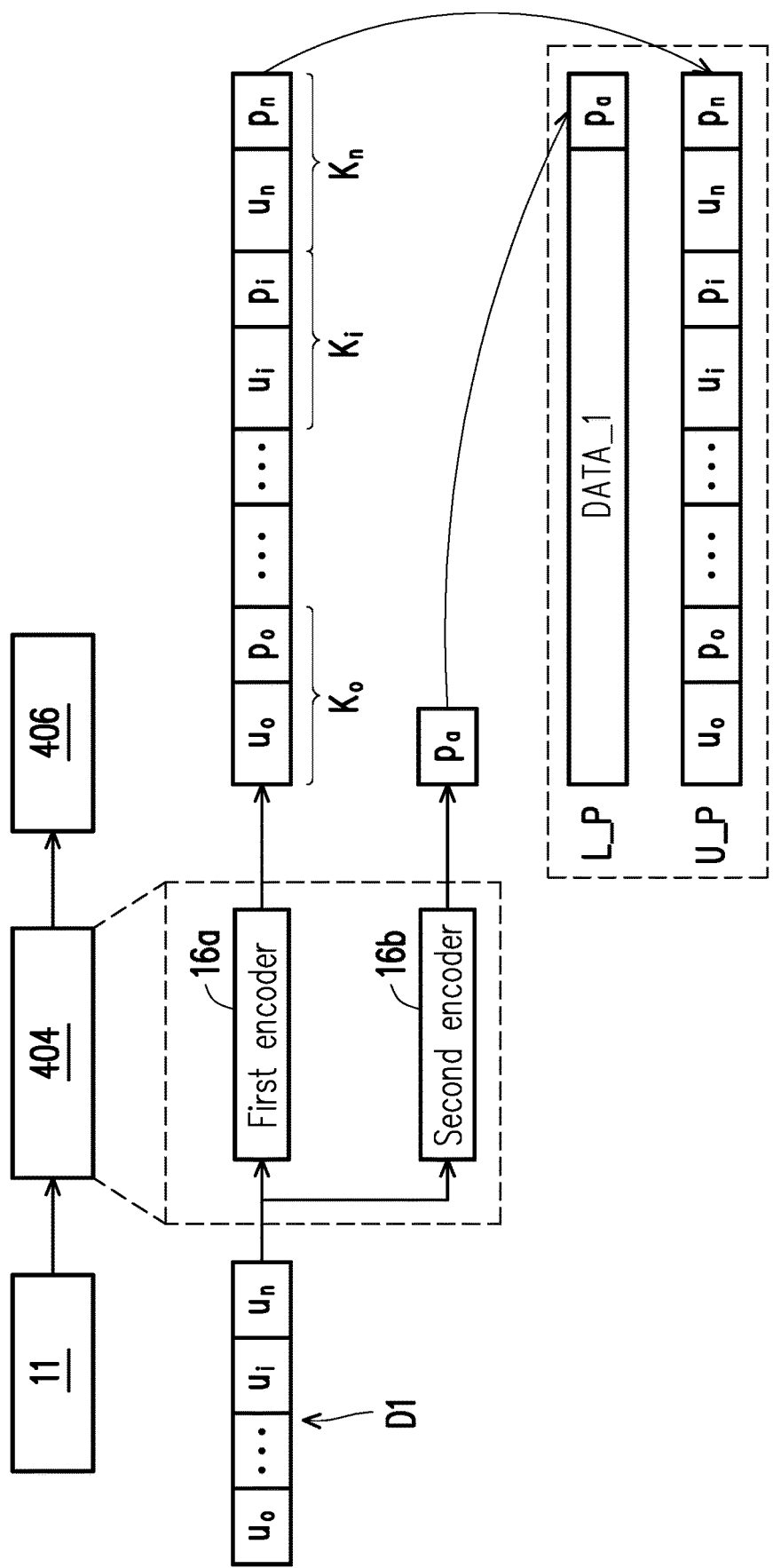
FIG. 16 is a schematic diagram for encoding data during writing according to an exemplary embodiment.
Figure 17:
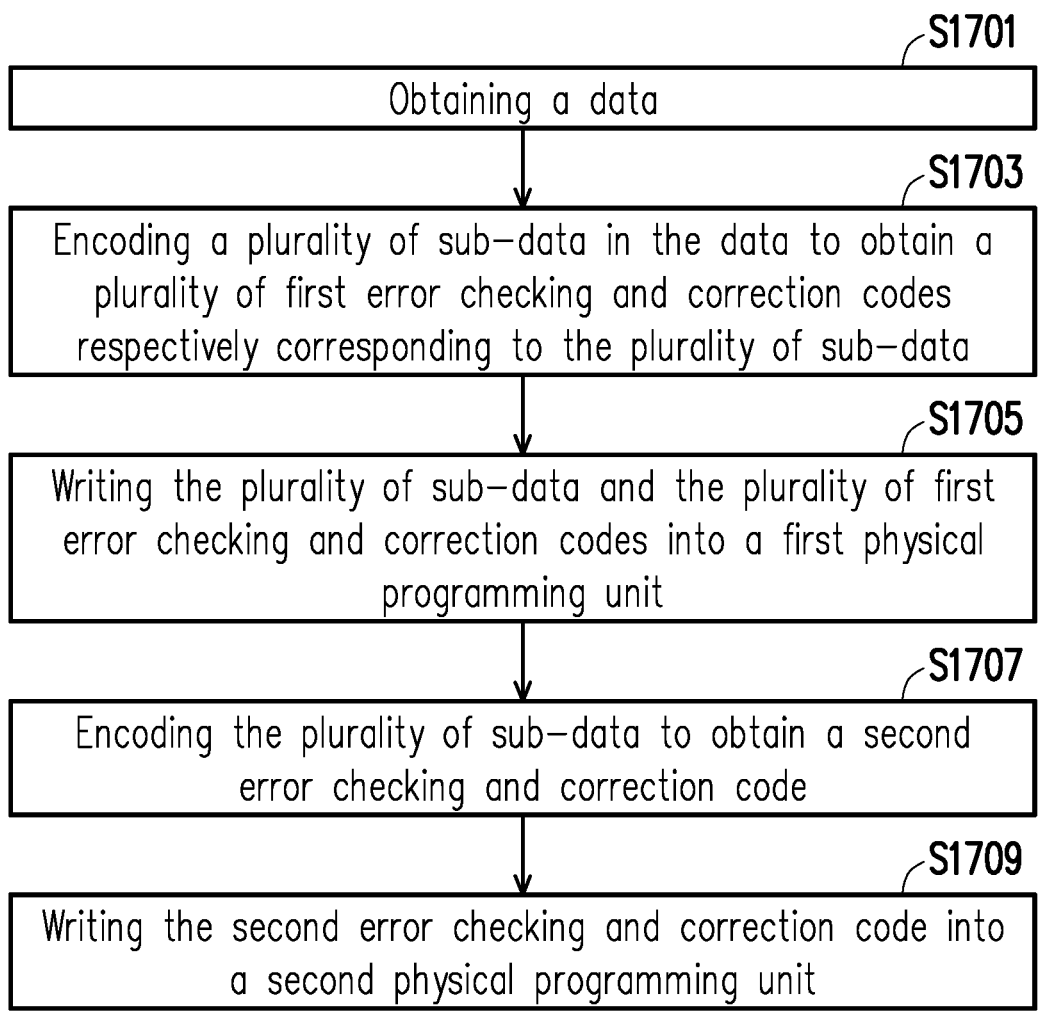
FIG. 17 is a flowchart for encoding data during writing according to an exemplary embodiment.

FIG. 16 is a schematic diagram for encoding data during writing according to an exemplary embodiment. FIG. 17 is a flowchart for encoding data during writing according to an exemplary embodiment.

Referring to FIG. 16 and FIG. 17 together, the memory management circuit 702 in the memory controlling circuit unit 404 may obtain a data D1 from the host system 11 (step S1701). In this embodiment, it is assumed that the data D1 may include sub-data $u_i$, wherein i is a positive integer greater than or equal to 0 and less than or equal to n. Then, the error checking and correcting circuit 708 may use the matrix H to encode the sub-data $u_i$ in the data D1 through a first encoder 16a to obtain error checking and correction codes $p_i$ (a.k.a. first error checking and correction codes) respectively corresponding to the sub-data $u_i$, wherein i a positive integer greater than or equal to 0 and less than or equal to n (step S1703). The process of using the matrix H for encoding will be described in detail later.

After going through the foregoing steps, each sub-data will have a corresponding error check and correction code. For example, the error checking and correction code $p_0$ is used for checking and correcting the error bit in the sub-data $u_0$, the error checking and correction code $p_1$ is used for checking and correcting the error bit in the sub-data $u_1$, and so on and so forth. The sub-data and the error checking and correction code for correcting the sub-data may be referred as one sub-codeword. In the example of FIG. 16, the sub-data $u_i$ and the error checking and correction code $p_i$ for correcting the sub-data $u_i$ compose a sub-codeword $K_i$, wherein i is a positive integer greater than or equal to 0 and less than or equal to n.

After obtaining the sub-codeword $K_i$, the memory management circuit 702 may write the sub-codeword $K_i$ into a physical programming unit U_P (a.k.a. a first physical programming unit) in the rewritable non-volatile memory module 406 (step S1705).

In addition, the error checking and correcting circuit 708 further uses the matrix H to encode the sub-data $u_i$ in the data D1 through a second encoder 16b to obtain an error checking and correction code $p_a$ (a.k.a. a second error checking and correction code) (step S1707). Then, the memory management circuit 702 may write the error checking and correction code $p_a$ into a physical programming unit L_P (a.k.a. a second physical programming unit) in the rewritable non-volatile memory module 406. In particular, the error checking and correction code $p_a$ is used for checking and correcting the error bit in the sub-data $u_i$ in the data D1. In this embodiment, it is assumed that the data D1 and the error checking and correction code $p_a$ for correcting the data D1 may be referred as one codeword $K_a$. Nonetheless, it should be noted that in other embodiments, the error checking and correcting circuit 708 may also use the matrix H to encode only a part of the sub-data $u_i$ in the data D1 through the second encoder 16b to obtain the error checking and correction code $p_a$, and the obtained error checking and correction code $p_a$ is used for checking and correcting the error bit in said part of the sub-data. In the example of the disclosure, during the process of generating the error checking and correction code $p_a$, the second encoder 16b encodes all the sub-data $u_i$. In addition, the physical programming unit L_P may be used to store (or write) other data DATA_1 related or unrelated to the data D1, and the content of the other data DATA_1 is not particularly limited herein.

In particular, during the process of using the matrix H to encode the sub-data $u_i$ to obtain the error checking and correction code $p_i$ and the error checking and correction code $p_a$, the following conditions (1) and (2) need to be satisfied.

$$K_i H_i^T = 0 \quad (1)$$

$$K_a H^T = 0 \quad (2)$$

Here, the codeword $K_a$ represents a combination of sub-data D1 (i.e., all the sub-data $u_i$) and the error checking and correction code $p_a$. In the condition (1), with the sub-data $u_0$ as an example, the memory management circuit 702 finds the error checking and correction code $p_0$ corresponding to the sub-data $u_0$, and the sub-codeword $K_0$ composed of the sub-data $u_0$ and the error checking and correction code $p_0$ needs to satisfy a relation of "$K_0 H_0^T = 0$". Relations between the other sub-codewords and the sub-matrices may be deduced form the above, which is not repeated hereinafter. The codeword $K_a$ composed of the sub-data D1 and the error checking and correction code $p_a$ needs to satisfy the condition (2).

In particular, in this embodiment, a reliability of the physical programming unit L_P is higher than a reliability of the physical programming unit U_P. In other words, a probability of error occurring in decoding the data stored in the physical programming unit L_P is smaller than a probability of error occurring in decoding the data stored in the physical programming unit U_P. The physical programming unit L_P is, for example, the lower physical programming unit described above, and the physical programming unit U_P is, for example, the upper physical programming unit described above.

In addition, the first encoder 16a and the second encoder 16b may be implemented in the form of hardware, software, or firmware, which is not limited herein.

Figure 18:
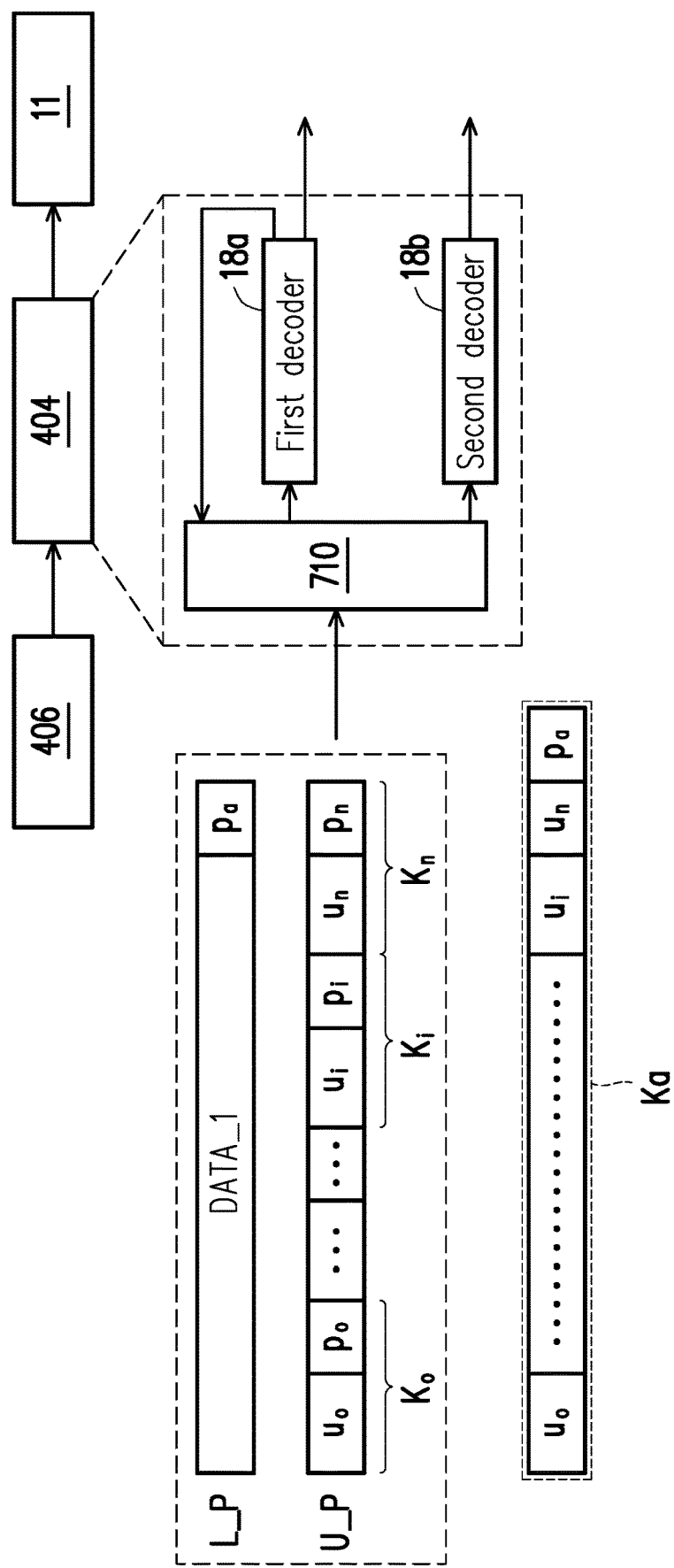
FIG. 18 is a schematic diagram for decoding data during reading according to an exemplary embodiment.
Figure 19:
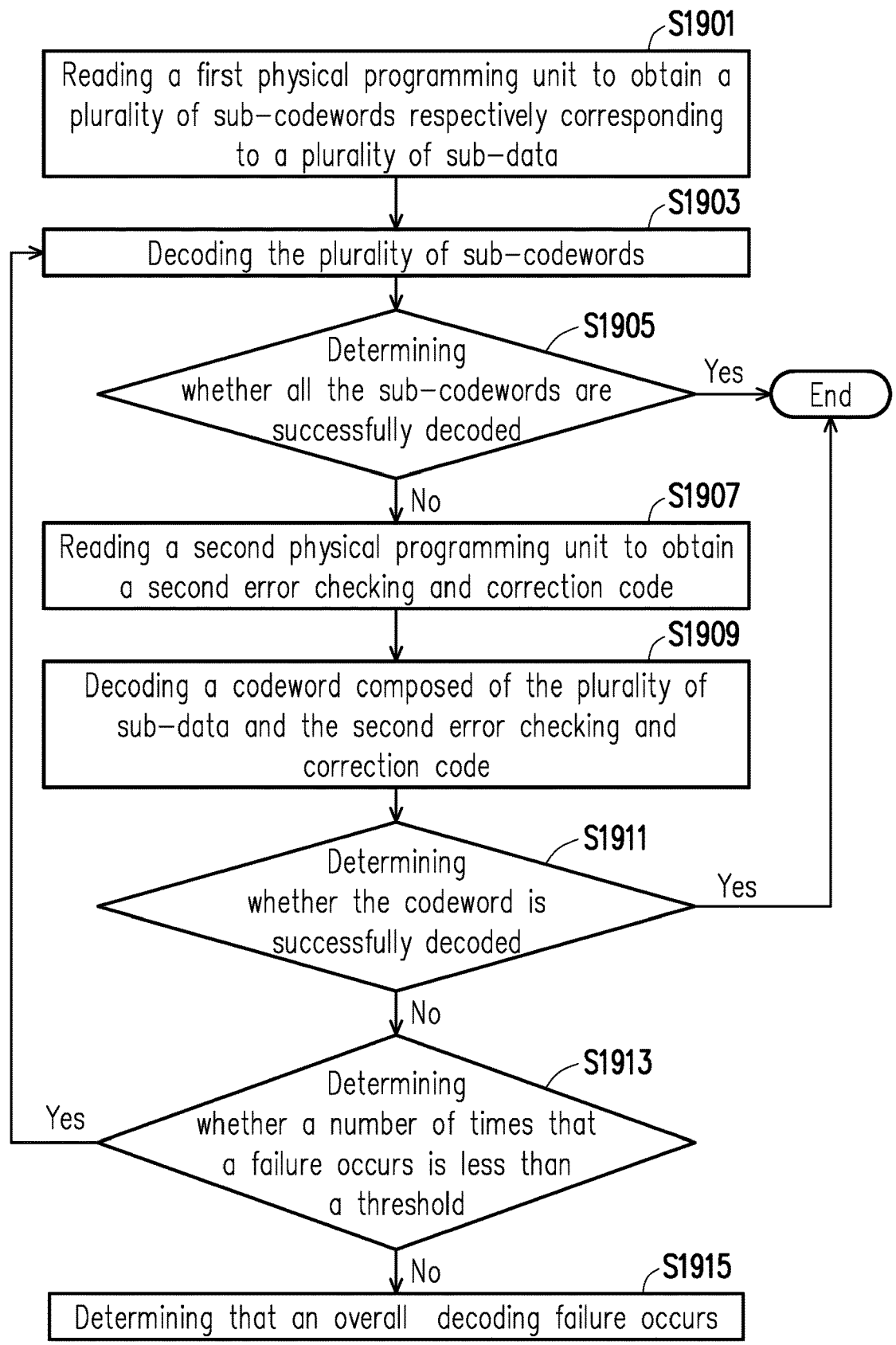
FIG. 19 is a flowchart for decoding data during reading according to an exemplary embodiment.

FIG. 18 is a schematic diagram for decoding data during reading according to an exemplary embodiment. FIG. 19 is a flowchart for decoding data during reading according to an exemplary embodiment.

Referring to FIG. 18 and FIG. 19 together, the memory management circuit 702 in the memory controlling circuit unit 404 may receive a read command for reading the data D1 from the host system 11. According to the read command, the memory controlling circuit unit 404 reads the physical programming unit U_P described above to obtain a plurality of sub-codewords $K_i$ respectively corresponding to the sub-data $u_i$ in the data D1 (step S1901), and temporarily stores the sub-codewords K into the buffer memory 710. Here, i is a positive integer greater than or equal to 0 and less than or equal to n. It should be noted that, the sub-codewords $K_i$ read in FIG. 18 may be identical to or different from the sub-codewords K written in FIG. 16.

After reading the sub-codeword $K_i$, a first decoder 18a in the error checking and correcting circuit 708 decodes the sub-codewords $K_i$ read in step S1901 (step S1903). Then, the memory controlling circuit unit 404 determines whether all the sub-codewords K are successfully decoded (step S1905). Here, the decoding method is to, for example, use the aforementioned matrix H with low-density parity-check, and when all the sub-codewords K satisfy the condition (1), the memory controlling circuit unit 404 determines that all the sub-codewords K are successfully decoded. The memory controlling circuit unit 404 controls the first decoder 18a to output a decoded data obtained by decoding the sub-codewords K and stop decoding.

When one of the sub-codewords $K_i$ is not successfully decoded, the memory controlling circuit unit 404 reads the physical programming unit L_P to obtain the error checking and correction code $p_a$ (step S1907). A second decoder 18b in the error checking and correcting circuit 708 decodes the codeword $K_a$ composed of the sub-data $u_i$ and the error checking and correction code $p_a$ (step S1909).

Then, the memory controlling circuit unit 404 determines whether the codeword $K_a$ is successfully decoded (step S1911). The decoding method is to, for example, use the aforementioned matrix H with low-density parity-check, and when all the sub-codewords $K_i$ satisfy the condition (1) and the codeword $K_a$ satisfies the condition (2), the memory controlling circuit unit 404 determines that the codeword $K_a$ is successfully decoded. When the codeword is successfully decoded, the memory controlling circuit unit 404 controls the second decoder 18b to output another decoded data obtained by decoding the codeword $K_a$ and stop decoding.

However, when a failure occurs in decoding the codeword $K_a$, the memory controlling circuit unit 404 determines whether a number of times that the failure occurs is less than a threshold (step S1913). When the failure occurs in decoding the codeword $K_a$ and the number of times that the failure occurs is less than the threshold, the memory controlling circuit unit 404 controls the second decoder 18b to perform step S1903 so as to decode the sub-codewords $K_i$ again.

Here, it should be noted that, in the decoding process of step S1903, some bits in certain sub-codewords may be flipped (e.g., corrected), and related information regarding the sub-codewords having the flipped bits may be recorded in the buffer memory 710. In step S1909 described above, the second decoder 18b may read said related information to obtain the sub-codewords having the flipped bits for decoding together with the error checking and correction code $p_a$. In particular, in the decoding process of step S1909, some bits in certain sub-codewords may be flipped (e.g., corrected), and related information regarding the sub-codewords having the flipped bits may also be recorded in the buffer memory 710. When returning to step S1903, the first decoder 18a may read said related information to obtain the sub-codewords having the flipped bits for decoding once again. In other words, by repeatedly flipping the bits for decoding repeatedly, the probability of successful decoding may be increased.

However, when the failure occurs in decoding the codeword $K_a$ and the number of times that the failure occurs is not less than the threshold, the memory controlling circuit unit 404 determines that an overall decoding failure occurs (step S1915).

It should be noted that, the first decoder 18a and the second decoder 18b may be implemented in the form of hardware, software, or firmware, which is not limited herein.

It should be noted that operation modes of the first decoder 18a and the second decoder 18b are not limited to the flowchart of FIG. 19. In an embodiment, the second decoder 18b is activated only when a decoding count of the first decoder 18a on the sub-codewords reaches a first preset value (e.g., an upper limit count) and yet the sub-codewords are still not successfully decoded, so as to decode the codeword $K_a$ composed of the sub-data $u_i$ and the error checking and correction code $p_a$ until the sub-data $u_i$ are successfully decoded or the decoding count reaches a second preset value (e.g., another upper limit count). In this example, during the operation of the second decoder 18b, the operation of the first decoder 18a is not returned.

In another embodiment, when the decoding count of the first decoder 18a on the sub-codewords reaches a third preset value (e.g., a non-upper limit count) and yet the sub-codewords are still not successfully decoded, the second decoder 18b is activated to decode the codeword $K_a$ composed of the sub-data $u_i$ and the error checking and correction code $p_a$ until the sub-data $u_i$ are successfully decoded or a decoding count reaches a fourth preset value (e.g., another non-upper limit count). In this example, when the decoding count of the second decoder 18b reaches the fourth preset value, the operation that the first decoder 18a decodes the sub-codewords may be performed again.

In summary, the data writing method, the memory controlling circuit unit and the memory storage device of the disclosure can generate multiple error checking and correction codes for a data, and store one of the error checking and correction codes into the physical programming unit with the higher reliability. In this way, as the probability of error occurring in the error checking and correction code stored in the physical programming unit with the higher reliability is lower, the data stored in the physical programming units with the lower reliability may be effectively improved and the probability of successful decoding may also be improved.

The previously described exemplary embodiments of the present disclosure have the advantages aforementioned, wherein the advantages aforementioned not required in all versions of the present disclosure.

It will be apparent to those skilled in the art that various modifications and variations can be made to the structure of the disclosure without departing from the scope or spirit of the disclosure. In view of the foregoing, it is intended that the present disclosure cover modifications and variations of this disclosure provided they fall within the scope of the following claims and their equivalents.

What is claimed is:

1. A data writing method for a rewritable non-volatile memory module, wherein the rewritable non-volatile memory module comprises a plurality of physical erasing units, each physical erasing unit among the plurality of physical erasing units comprises a plurality of physical programming units, and the method comprises:
   obtaining a data;
   encoding a plurality of sub-data in the data to obtain a plurality of first error checking and correction codes respectively corresponding to the plurality of sub-data;
   writing the plurality of sub-data and the plurality of first error checking and correction codes into a first physical programming unit among the plurality of physical programming units;
   encoding the plurality of sub-data to obtain a second error checking and correction code;
   writing the second error checking and correction code into a second physical programming unit among the plurality of physical programming units;
   receiving a read command for reading the data;
   according to the read command, reading the first physical programming unit to obtain a plurality of sub-codewords respectively corresponding to the plurality of sub-data, and decoding the plurality of sub-codewords;
   when one of the plurality of sub-codewords is not successfully decoded, reading the second physical programming unit to obtain the second error checking and correction code; and
   decoding a codeword composed of the plurality of sub-data and the second error checking and correction code.

2. The data writing method according to claim 1, wherein a probability of error occurring in decoding the data stored in the second physical programming unit is smaller than a probability of error occurring in decoding the data stored in the first physical programming unit.

3. The data writing method according to claim 1, further comprising:
   when a failure occurs in decoding the codeword composed of the plurality of sub-data and the second error checking and correction code and a number of times that the failure occurs is less than a threshold, performing the step of decoding the plurality of sub-codewords again; and
   when the failure occurs in decoding the codeword composed of the plurality of sub-data and the second error checking and correction code and the number of times that the failure occurs is not less than the threshold, determining that an overall decoding failure occurs.

4. The data writing method according to claim 3, wherein the step of decoding the plurality of sub-codewords comprises:
   when all the plurality of sub-codewords are successfully decoded, outputting a decoded data obtained by decoding the plurality of sub-codewords and stopping decoding,
   wherein the step of decoding the codeword composed of the plurality of sub-data and the second error checking and correction code comprises:
   when the codeword is successfully decoded, outputting another decoded data obtained by decoding the codeword and stopping decoding.

5. The data writing method according to claim 1, further comprising:
   setting a matrix, wherein the matrix comprises an additional matrix and a plurality of sub-matrices respectively corresponding to the plurality of sub-data;
   wherein the step of encoding the plurality of sub-data in the data to obtain the plurality of first error checking and correction codes respectively corresponding to the plurality of sub-data comprises:
   encoding the plurality of sub-data according to the plurality of sub-matrices to obtain the plurality of first error checking and correction codes respectively corresponding to the plurality of sub-data,
   wherein the step of encoding the plurality of sub-data to obtain the second error checking and correction code comprises:
   encoding the plurality of sub-data according to the additional matrix and the plurality of sub-matrices to obtain the second error checking and correction code.

6. The data writing method according to claim 1, wherein the step of encoding the plurality of sub-data to obtain the second error checking and correction code comprises:
   encoding only a part of the plurality of sub-data to obtain the second error checking and correction code.

7. A memory controlling circuit unit for a rewritable non-volatile memory module, the rewritable non-volatile memory module comprising a plurality of physical erasing units, each physical erasing unit among the plurality of physical erasing units comprising a plurality of physical programming units, the memory controlling circuit unit comprising:
   a host interface, configured to couple to a host system;
   an error checking and correcting circuit;
   a memory interface, configured to couple to the rewritable non-volatile memory module; and
   a memory management circuit, coupled to the host interface, the error checking and correcting circuit and the memory interface,
   wherein the memory management circuit is configured to obtain a data,
   wherein the error checking and correcting circuit is configured to encode a plurality of sub-data in the data to obtain a plurality of first error checking and correction codes respectively corresponding to the plurality of sub-data,
   wherein the memory management circuit is further configured to write the plurality of sub-data and the plurality of first error checking and correction codes into a first physical programming unit among the plurality of physical programming units,
   wherein the error checking and correcting circuit is further configured to encode the plurality of sub-data to obtain a second error checking and correction code,
   wherein the memory management circuit is further configured to write the second error checking and correction code into a second physical programming unit among the plurality of physical programming units, wherein
   the memory management circuit is further configured to receive a read command for reading the data,
   according to the read command, the memory management circuit is further configured to read the first physical programming unit to obtain a plurality of sub-codewords respectively corresponding to the plurality of sub-data, and decode the plurality of sub-codewords through the error checking and correcting circuit,
   when one of the plurality of sub-codewords is not successfully decoded, the memory management circuit is further configured to read the second physical programming unit to obtain the second error checking and correction code, and decode a codeword composed of the plurality of sub-data and the second error checking and correction code through the error checking and correcting circuit.

8. The memory controlling circuit unit according to claim 7, wherein a probability of error occurring in decoding the data stored in the second physical programming unit is smaller than a probability of error occurring in decoding the data stored in the first physical programming unit.

9. The memory controlling circuit unit according to claim 7, wherein
when a failure occurs in decoding the codeword composed of the plurality of sub-data and the second error checking and correction code and a number of times that the failure occurs is less than a threshold, the error checking and correcting circuit performs the operation of decoding the plurality of sub-codewords again,
when the failure occurs in decoding the codeword composed of the plurality of sub-data and the second error checking and correction code and the number of times that the failure occurs is not less than the threshold, the error checking and correcting circuit determines that an overall decoding failure occurs.

10. The memory controlling circuit unit according to claim 9, wherein in the operation of decoding the plurality of sub-codewords,
when all the plurality of sub-codewords are successfully decoded, the memory management circuit is further configured to output a decoded data obtained by decoding the plurality of sub-codewords and stop decoding,
wherein in the operation of decoding the codeword composed of the plurality of sub-data and the second error checking and correction code,
when the codeword is successfully decoded, the memory management circuit is further configured to output another decoded data obtained by decoding the codeword and stop decoding.

11. The memory controlling circuit unit according to claim 7, wherein
the memory management circuit is further configured to set a matrix, wherein the matrix comprises an additional matrix and a plurality of sub-matrices respectively corresponding to the plurality of sub-data,
wherein in the operation of encoding the plurality of sub-data in the data to obtain the plurality of first error checking and correction codes respectively corresponding to the plurality of sub-data,
the error checking and correcting circuit is further configured to encode the plurality of sub-data according to the plurality of sub-matrices to obtain the plurality of first error checking and correction codes respectively corresponding to the plurality of sub-data,
wherein in the operation of encoding the plurality of sub-data to obtain the second error checking and correction code,
the error checking and correcting circuit is further configured to encode the plurality of sub-data according to the additional matrix and the plurality of sub-matrices to obtain the second error checking and correction code.

12. The memory controlling circuit unit according to claim 7, wherein in the operation of encoding the plurality of sub-data to obtain the second error checking and correction code,
the error checking and correcting circuit encodes only a part of the plurality of sub-data to obtain the second error checking and correction code.

13. A memory storage device, comprising:
a connection interface unit configured to couple to a host system;
a rewritable non-volatile memory module, the rewritable non-volatile memory module comprising a plurality of physical erasing units, each physical erasing unit among the physical erasing units comprising a plurality of physical programming units; and
a memory controlling circuit unit, coupled to the connection interface unit and the rewritable non-volatile memory module,
wherein the memory controlling circuit unit is configured to obtain a data,
wherein the memory controlling circuit unit is configured to encode a plurality of sub-data in the data to obtain a plurality of first error checking and correction codes respectively corresponding to the plurality of sub-data,
wherein the memory controlling circuit unit is further configured to write the plurality of sub-data and the plurality of first error checking and correction codes into a first physical programming unit among the plurality of physical programming units,
wherein the memory controlling circuit unit is further configured to encode the plurality of sub-data to obtain a second error checking and correction code,
wherein the memory controlling circuit unit is further configured to write the second error checking and correction code into a second physical programming unit among the plurality of physical programming units,
the memory controlling circuit unit is further configured to receive a read command for reading the data,
according to the read command, the memory controlling circuit unit is further configured to read the first physical programming unit to obtain a plurality of sub-codewords respectively corresponding to the plurality of sub-data, and decode the plurality of sub-codewords,
when one of the plurality of sub-codewords is not successfully decoded, the memory controlling circuit unit is further configured to read the second physical programming unit to obtain the second error checking and correction code, and decode a codeword composed of the plurality of sub-data and the second error checking and correction code.

14. The memory storage device according to claim 13, wherein a probability of error occurring in decoding the data stored in the second physical programming unit is smaller than a probability of error occurring in decoding the data stored in the first physical programming unit.

15. The memory storage device according to claim 13, wherein
when a failure occurs in decoding the codeword composed of the plurality of sub-data and the second error checking and correction code and a number of times that the failure occurs is less than a threshold, the memory controlling circuit unit is further configured to perform the operation of decoding the plurality of sub-codewords again,
when the failure occurs in decoding the codeword composed of the plurality of sub-data and the second error checking and correction code and the number of times that the failure occurs is not less than the threshold, the memory controlling circuit unit is further configured to determine that an overall decoding failure occurs.

16. The memory storage device according to claim 15, wherein in the operation of decoding the plurality of sub-codewords,
when all the plurality of sub-codewords are successfully decoded, the memory controlling circuit unit is further configured to output a decoded data obtained by decoding the plurality of sub-codewords and stop decoding,
wherein in the operation of decoding the codeword composed of the plurality of sub-data and the second error checking and correction code,
when the codeword is successfully decoded, the memory controlling circuit unit is further configured to output another decoded data obtained by decoding the codeword and stop decoding.

17. The memory storage device according to claim 13, wherein
the memory controlling circuit unit is further configured to set a matrix, wherein the matrix comprises an additional matrix and a plurality of sub-matrices respectively corresponding to the plurality of sub-data,
wherein in the operation of encoding the plurality of sub-data in the data to obtain the plurality of first error checking and correction codes respectively corresponding to the plurality of sub-data,
the memory controlling circuit unit is further configured to encode the plurality of sub-data according to the plurality of sub-matrices to obtain the plurality of first error checking and correction codes respectively corresponding to the plurality of sub-data,
wherein in the operation of encoding the plurality of sub-data to obtain the second error checking and correction code,
the memory controlling circuit unit is further configured to encode the plurality of sub-data according to the additional matrix and the plurality of sub-matrices to obtain the second error checking and correction code.

18. The memory storage device according to claim 13, wherein in the operation of encoding the plurality of sub-data to obtain the second error checking and correction code,
the memory controlling circuit unit encodes only a part of the plurality of sub-data to obtain the second error checking and correction code.

\* \* \* \* \*